(12) United States Patent
Cole et al.

(10) Patent No.: US 12,107,039 B2
(45) Date of Patent: Oct. 1, 2024

(54) POWER COMPONENT CONFIGURED FOR IMPROVING PARTIAL DISCHARGE PERFORMANCE AND SYSTEM AND PROCESS OF IMPLEMENTING THE SAME

(71) Applicant: CREE FAYETTEVILLE, INC., Fayetteville, AR (US)

(72) Inventors: Zach Cole, Summers, AR (US); Steven Ericksen, Rogers, AR (US)

(73) Assignee: Wolfspeed, Inc., Durham, NC (US)

( * ) Notice: Subject to any disclaimer, the term of this patent is extended or adjusted under 35 U.S.C. 154(b) by 735 days.

(21) Appl. No.: 17/207,223

(22) Filed: Mar. 19, 2021

(65) Prior Publication Data
US 2022/0302014 A1 Sep. 22, 2022

(51) Int. Cl.
*H01L 23/50* (2006.01)
*H01L 23/528* (2006.01)
*H05K 5/00* (2006.01)

(52) U.S. Cl.
CPC .......... *H01L 23/50* (2013.01); *H01L 23/5286* (2013.01)

(58) Field of Classification Search
CPC ........................... H01L 23/50; H01L 23/5286
See application file for complete search history.

(56) References Cited

U.S. PATENT DOCUMENTS

| 7,806,711 B2 * | 10/2010 | Andersen | H01R 25/145 |
| | | | 439/475 |
| 2016/0336245 A1 * | 11/2016 | Egusa | H01R 12/585 |
| 2018/0206359 A1 * | 7/2018 | McPherson | H05K 7/14329 |

* cited by examiner

*Primary Examiner* — Peniel M Gumedzoe
(74) *Attorney, Agent, or Firm* — BakerHostetler

(57) ABSTRACT

A power component configured to improve partial discharge performance includes at least one terminal that includes a first planar surface, a second planar surface opposite the first planar surface, and a curved surface extending from the first planar surface to the second planar surface. The power component may include at least one of the following: a power module or a bus bar.

26 Claims, 21 Drawing Sheets

| Gap (in mm) | Round or Sharp Edges | Fluormert Fill (in %) | Inception Voltage (in kV) |
|---|---|---|---|
| 2.5 | Sharp | 0 % | 9.14 |
| 2.5 | Round | 0 % | 13.27 |
| 2.5 | Sharp | 33 % | 10.03 |
| 2.5 | Round | 33 % | 12.5 |
| 2.5 | Sharp | 100 % | 8.78 |
| 2.5 | Round | 100 % | 27.48 |

Figure 16

POWER COMPONENT CONFIGURED FOR IMPROVING PARTIAL DISCHARGE PERFORMANCE AND SYSTEM AND PROCESS OF IMPLEMENTING THE SAME

BACKGROUND OF THE DISCLOSURE

1. Field of the Disclosure

This disclosure is directed to a power component configured for improving partial discharge performance. This disclosure is further directed to a process of implementing a power component configured for improving partial discharge performance.

This disclosure is further directed to a power system implementing a power component configured for improving partial discharge performance. This disclosure is further directed to a process of implementing a power system implementing a power component configured for improving partial discharge performance.

2. Related Art

Various power components typically provide, receive, and/or control the delivery of power and often include terminals, buss bars, power devices, power modules, and/or the like. As will be appreciated by those skilled in the art, power modules are known in various forms. Power modules provide a physical containment for power devices, usually power semiconductor devices. The power module typically carries power semiconductors, provides electrical and thermal contact, includes electrical insulation, and electrical terminals for power input and/or power output. The terminals of the power module may connect to the buss bars. Current trends in electrification are placing increasing demands on power components including increasing power, voltage, current, and/or the like.

However, increases in power, voltage, current, and/or the like in power components also increase the likelihood of partial discharge (PD), which typically is a localized dielectric breakdown of a component under high voltage, high current, high-power, and/or the like. The partial discharge can occur in a gaseous (including air) insulating medium, a liquid insulating medium, and/or a solid insulating medium. The partial discharge can dissipate energy and accordingly reduce energy efficiency of the system. The effects of partial discharge in a power component can also cause thermal degradation, accelerate failures, and/or the like.

Accordingly, what is needed is a power component configured to improve partial discharge performance, reduce partial discharge, increase an inception voltage of a partial discharge, and/or the like.

SUMMARY OF THE DISCLOSURE

One general aspect includes a power component that includes at least one terminal may include a first planar surface, a second planar surface opposite the first planar surface, and a curved surface extending from the first planar surface to the second planar surface, where the power component may include at least one of the following: a power module or a buss bar.

One general aspect includes a process for configuring a power component that includes configuring at least one terminal with a first planar surface, a second planar surface opposite the first planar surface, and a curved surface extending from the first planar surface to the second planar surface; and implementing the at least one terminal in the power component and the power component may include at least one of the following: a power module or a buss bar.

One general aspect includes a power module that includes at least one electrically conductive power substrate; a housing arranged on the at least one electrically conductive power substrate; at least one terminal may include a first planar surface, a second planar surface opposite the first planar surface, and a curved surface extending from the first planar surface to the second planar surface; a plurality of power devices arranged on and connected to the at least one electrically conductive power substrate; and a base plate, where the at least one terminal is electrically connected to the at least one electrically conductive power substrate.

One general aspect includes a power system that includes a power module may include at least one terminal; and at least one buss bar electrically connected to the at least one terminal, the at least one terminal may include a first planar surface, a second planar surface opposite the first planar surface, and a curved surface extending from the first planar surface to the second planar surface; and the at least one buss bar may include a first planar surface, a second planar surface opposite the first planar surface, and a curved surface extending from the first planar surface to the second planar surface.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 16 illustrates a table of a partial discharge performance for power modules implementing conventional terminals and power modules implementing terminals according to the disclosure.

DETAILED DESCRIPTION OF THE DISCLOSURE

Figure 1:
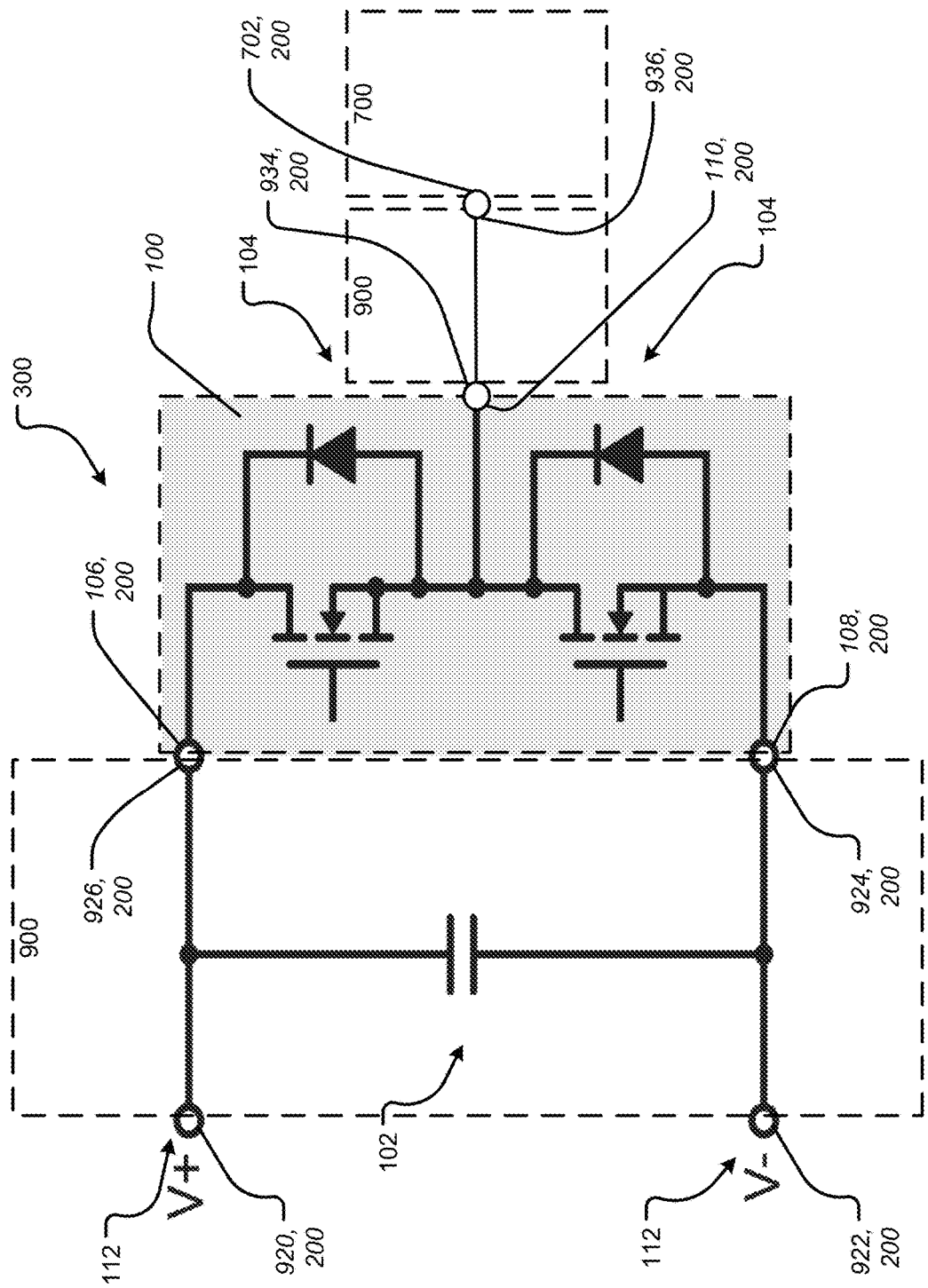
FIG. 1 schematically illustrates a power system implementing a power component according to aspects of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

This disclosure describes a power component that may be implemented in terminals, a power module, a buss bar, a power system, an application, and/or the like and may include structure optimized for state-of-the-art wide band gap power semiconductor devices such as Gallium Nitride (GaN), Silicon Carbide (SiC), and the like, which are capable of carrying high amounts of currents and voltages and switching at increasingly faster speeds in comparison with established technologies.

Technology for a power component that may be implemented in terminals, a power module, a buss bar, a power system, an application, and/or the like may use parts manufactured from flat sheet metal for numerous reasons such as cost, good inductance geometries, and/or the like. For example, punched out parts and/or cut out parts from flat sheet metal.

However, such flat sheet metal parts can typically exhibit poor partial discharge performance. For example, if the dielectric spacing is too small for a power component that may be implemented in terminals, a power module, a buss bar, a power system, an application and/or the like, then partial discharge becomes problematic. In particular, partial discharge may result in shorting of the power components, which may be inevitable with time, reduced energy efficiency of the system, thermal degradation, accelerated failures, and/or the like.

The disclosure is directed to power components that may be implemented in terminals, a power module, a buss bar, a power system, an application, and/or the like implementing features and/or processes in the design of the parts, and in the manufacture of them, wherein all, most, and/or some of the most critical edges of terminals and other power components may be rounded. Moreover, the disclosure is directed to configuring all, most, and/or some of the most critical edges of power components, such as terminals, in any high-voltage product with electrically-charged components which might initiate partial discharge during operation. In other words, the disclosure applies to any charged power components with "sharp" points or edges. Additionally, additional component features and processes that impact the inception voltage are further described herein including deburring power components such as the edges of terminals, power contacts, and/or the like; and polishing and/or deburring power components such as the edges of terminals, power contacts, and/or the like. In various aspects, the disclosure provides various components and/or processes to reduce a strength of an electric field near the edges and/or corners of charged components by implementing processes and configurations to round edges and/or corners. In some aspects, to round edges and/or corners to as large a radius as practical. In this regard, a power component that may be implemented in terminals, a power module, a buss bar, a power system, an application, and/or the like implementing components with a sharp edge may concentrate the field and decrease the inception voltage for partial discharge.

In one or more aspects, the disclosure focuses on implementing components and/or processes to the terminals of a power module, a bussing within a power system associated with a power module, an application, and/or the like. In this regard, a common format for power module terminals is some version of a sheet metal, which is shaped by cutting, stamping, etching, and/or the like and thus has "sharp" edges. For example, a 90 degree or sharper shapes from etching, square corners, burrs, and so forth from stamping, cutting, and/or the like manufacturing processes.

In one or more aspects, the disclosure devices and/or processes to reduce the strength of the electric field near the edges and/or corners of charged components by the design choice to round all edges and/or corners to as large a radius as practical. In this regard, a sharp edge may concentrate the field and decrease the inception voltage for partial discharge. In particular aspects, the disclosure provides devices and/or processes to apply the principle to the terminals of a power module, the bussing within a system that implements the power module, terminals of an application, and/or the like components. In this regard, a common format for power module terminals is some version of a sheet metal, which is shaped by cutting, stamping, etching, and/or the like and thus has "sharp" edges. For example, a 90 degree or sharper shape from etching, square corners, burrs and so forth from stamping, cutting, and/or the like.

The advantage of the disclosed features and/or processes can be to enable a power component that may be implemented in terminals, a power module, a buss bar, a power system, an application, and/or the like to have a partial discharge inception voltage rating higher than an otherwise identical power component, enable an implementation of power systems having tighter spacings, achieve a smaller power component size, lower inductances, increase power density, and/or the like without an accompanying increase in the partial discharge inception voltage.

The power component that may be implemented in terminals, a power module, a buss bar, a power system, an application, and/or the like that may connect to and/or utilize power devices that may range in structure and purpose. The term 'power device' refers to various forms of transistors and diodes designed for high voltages and currents. The transistors may be controllable switches allowing for unidirectional or bidirectional current flow (depending on device type) while the diodes may allow for current flow in one direction and may not controllable. The transistor types may include but are not limited to Metal Oxide Field Effect Transistor (MOSFET), a Junction Field Effect Transistor (JFET), Bipolar Junction Transistor (BJT), Insulated Gate Bipolar Transistor (IGBT), and/or the like.

The power devices may include Wide Band Gap (WBG) semiconductors, including Gallium Nitride (GaN), Silicon Carbide (SiC), and/or the like, and may offer numerous advantages over conventional Silicon (Si) as a material for the power devices. Nevertheless, various aspects of the disclosure may utilize Si type power devices and achieve a number of the benefits described herein.

FIG. 1 schematically illustrates a power system implementing a power component according to aspects of the disclosure.

In particular, FIG. 1 illustrates a power system 300 that may include one or more power components. In one aspect, the power system 300 may include a power module 100. In one aspect, the power system 300 may include a plurality of the power module 100. The power module 100 may include one or more switch positions 104. The power module 100 may include one or more power components that may include one or more implementations of a terminal 200. The terminal 200 as disclosed herein is structured and/or configured to improve partial discharge performance, reduce partial discharge, increase an inception voltage of a partial discharge, reduce a strength of an electric field near the edges and/or corners, and/or the like. The terminal 200 of the power module 100 may include, for example, a first terminal 106, a second terminal 108, a third terminal 110, and/or the like. However, the power module 100 may include any number of the terminal 200.

Additionally, the power system 300 may include power components that may include bussing 900 that includes one or more implementations of the terminal 200 that as disclosed herein is structured and/or configured to improve partial discharge performance, reduce partial discharge, increase an inception voltage of a partial discharge, reduce a strength of an electric field near the edges and/or corners, and/or the like. For example, the terminal 200 of the bussing 900 may be implemented as a first buss bar terminal 926, a second buss bar terminal 924, a third buss bar terminal 934, a fourth buss bar terminal 920, a fifth buss bar terminal 922, a sixth buss bar terminal 936, and/or the like. However, the bussing 900 may include any number of the terminal 200.

As further illustrated in FIG. 1, the terminal 200 of the bussing 900 may connect to the terminal 200 of the power module 100. In the aspect as shown in FIG. 1, the first terminal 106 of the power module 100 may connect to the first buss bar terminal 926 of the bussing 900; the second terminal 108 of the power module 100 may connect to the second buss bar terminal 924 of the bussing 900; and the third terminal 110 of the power module 100 may connect to the third buss bar terminal 934 of the bussing 900. Additionally, the bussing 900 may include the fourth buss bar terminal 920 and the fifth buss bar terminal 922 that may connect to a DC supply 112. However, the disclosure contemplates any number of the terminal 200 and any configurations of the terminal 200 in the power system 300 as it relates to the bussing 900 and the power module 100. Additionally, the disclosure contemplates any number or type of the bussing 900 and the power module 100.

Additionally, the power system 300 may also include additional implementations of power components that may include the terminal 200. For example, the power system 300 may connect to an application 700 and/or may include the application 700. In one aspect, the application 700 may include one or more implementations of the terminal 200 that as disclosed herein is structured and/or configured to improve partial discharge performance, reduce partial discharge, increase an inception voltage of a partial discharge, reduce a strength of an electric field near the edges and/or corners, and/or the like. For example, the terminal 200 of the application 700 may be implemented as a terminal 702.

The application 700 may include any number of applications operating with the power system 300 and/or one or more of the power module 100. In one or more aspects, the application 700 may be a power system, a motor system, a motor drive, an automotive motor system, a charging system, an automotive charging system, a vehicle system, an industrial motor drive, an embedded motor drive, an uninterruptible power supply, an AC-DC power supply, a welder power supply, a military system, an inverter, an inverter for wind turbines, solar power panels, tidal power plants, electric vehicles (EVs), and/or the like, a converter, a solar inverter, a circuit breaker, a protection circuit, a DC-DC converter, an Off-Board DC Fast Charger for an electric vehicle (EV), an on-board DC/DC Converters for an electric vehicle (EV), an on-board battery charger for an electric vehicle (EV), an electric vehicle (EV) Powertrain/Main Inverter, an electric vehicle (EV) charging infrastructure, an electric traction motor, a motor drive for an electric motor, a commercial inductive heating system, an uninterruptible power system, and/or the like.

As illustrated in FIG. 1, the power module 100 of the power system 300 may be implemented utilizing a half-bridge based topology that may be a fundamental building block in many applications. In this regard, some applications may be connected to the DC supply 112, with a bank of DC link capacitors 102 as an intermediate connection. The DC link capacitors 102 may act to filter ripple on the line and counter the effects of inductance in a current path. The DC link capacitors 102 may include one or more of the terminal 200 as described herein and the bussing 900 connecting to the DC link capacitors 102 may also include one or more of the terminal 200 as described herein.

In further aspects, the power system 300 may be implemented utilizing two half-bridges in parallel that may form a full-bridge utilizing one or more implementations of the power module 100; the power system 300 may be implemented utilizing three half-bridges in parallel utilizing one or more implementations of the power module 100 that may form a three phase topology. Moreover, other topologies are contemplated for the power system 300 and/or one or more implementations of the power module 100 including a full-bridge configuration, a common source configuration, a common drain configuration, a neutral point clamp configuration, and/or the like.

Figure 2:
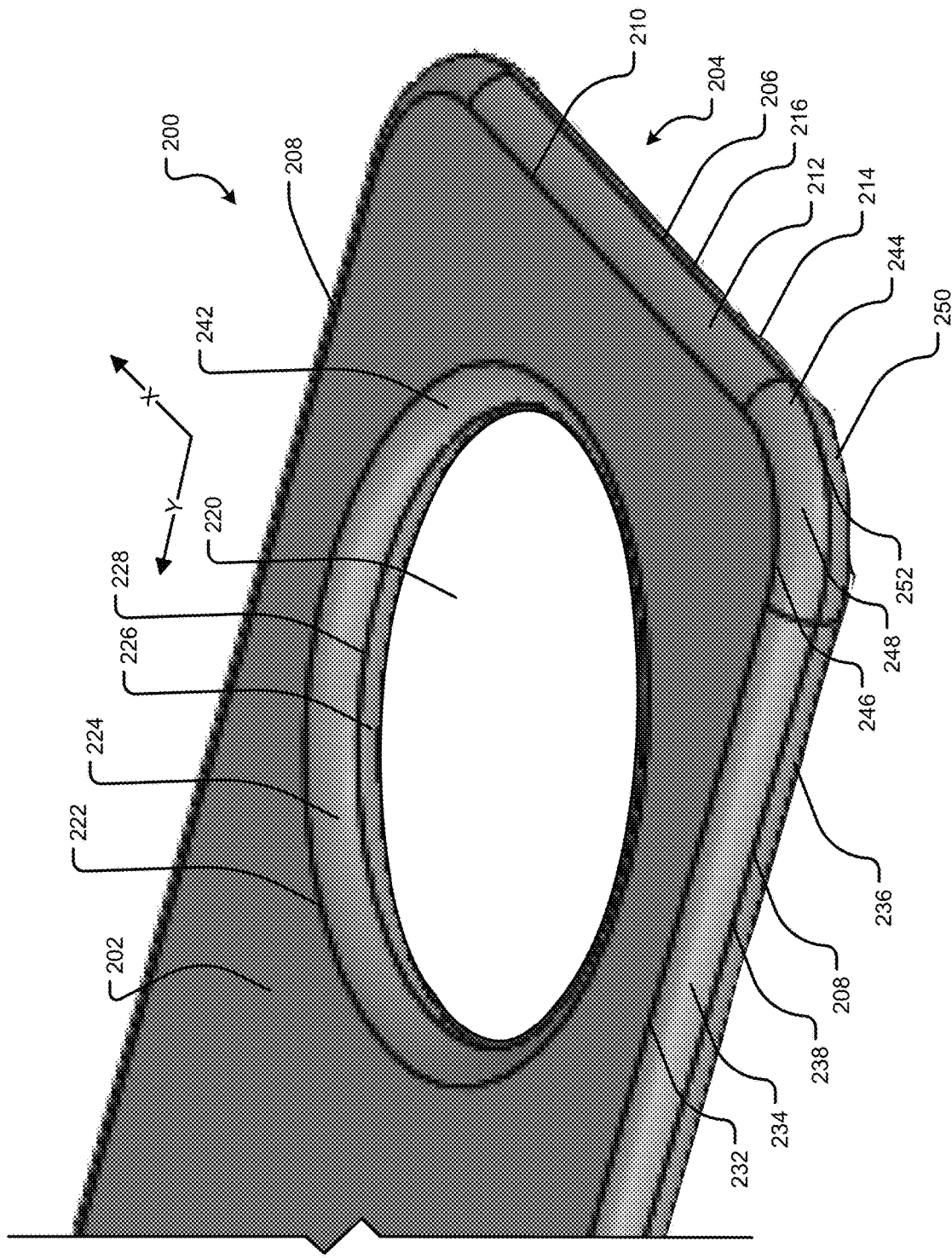
FIG. 2 illustrates a perspective view of an exemplary terminal according to aspects of the disclosure.

FIG. 2 illustrates a perspective view of an exemplary terminal according to aspects of the disclosure.

Figure 3:
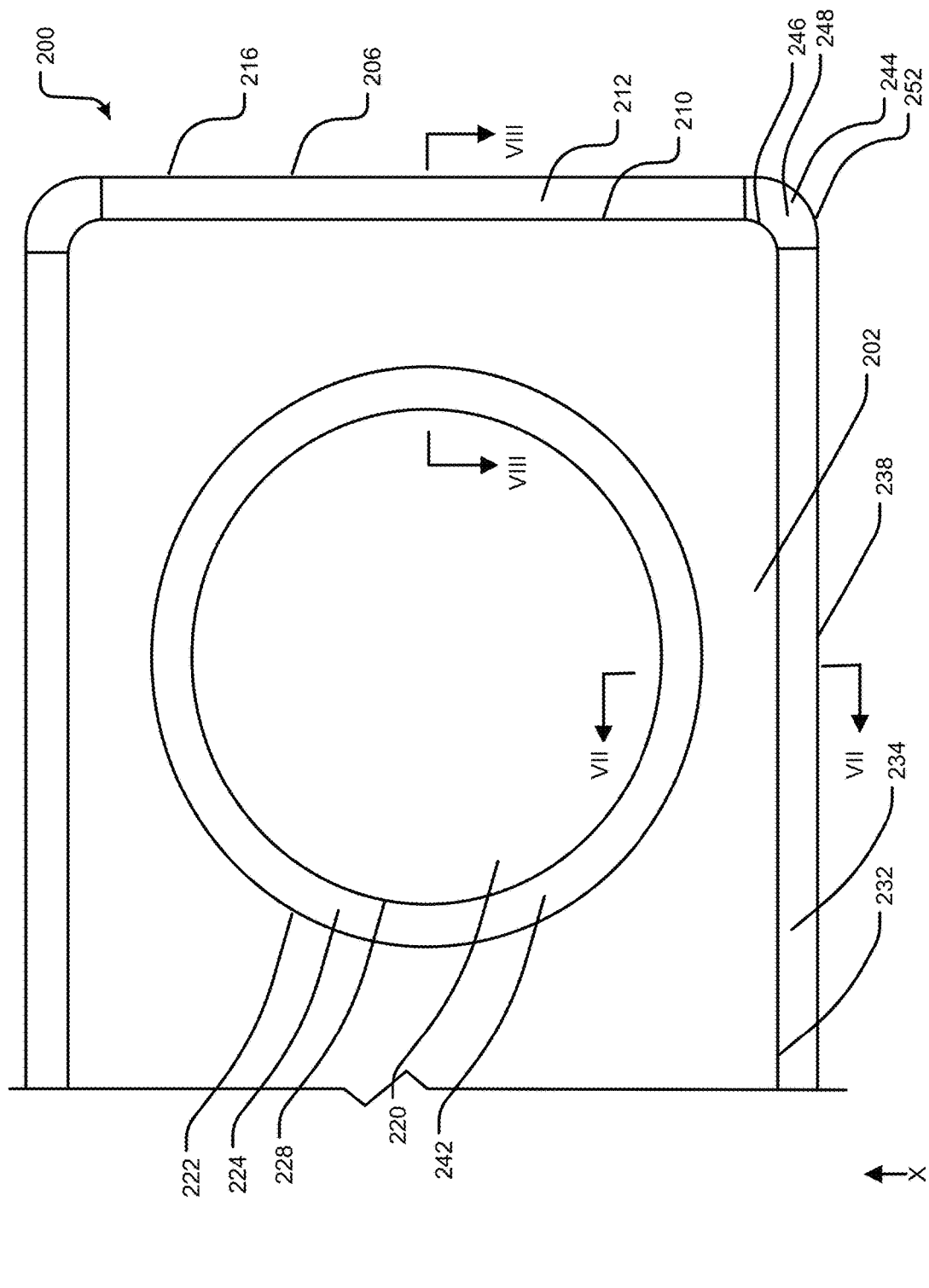
FIG. 3 illustrates a top view of the exemplary terminal according to FIG. 2.

FIG. 3 illustrates a top view of the exemplary terminal according to FIG. 2.

Figure 4:
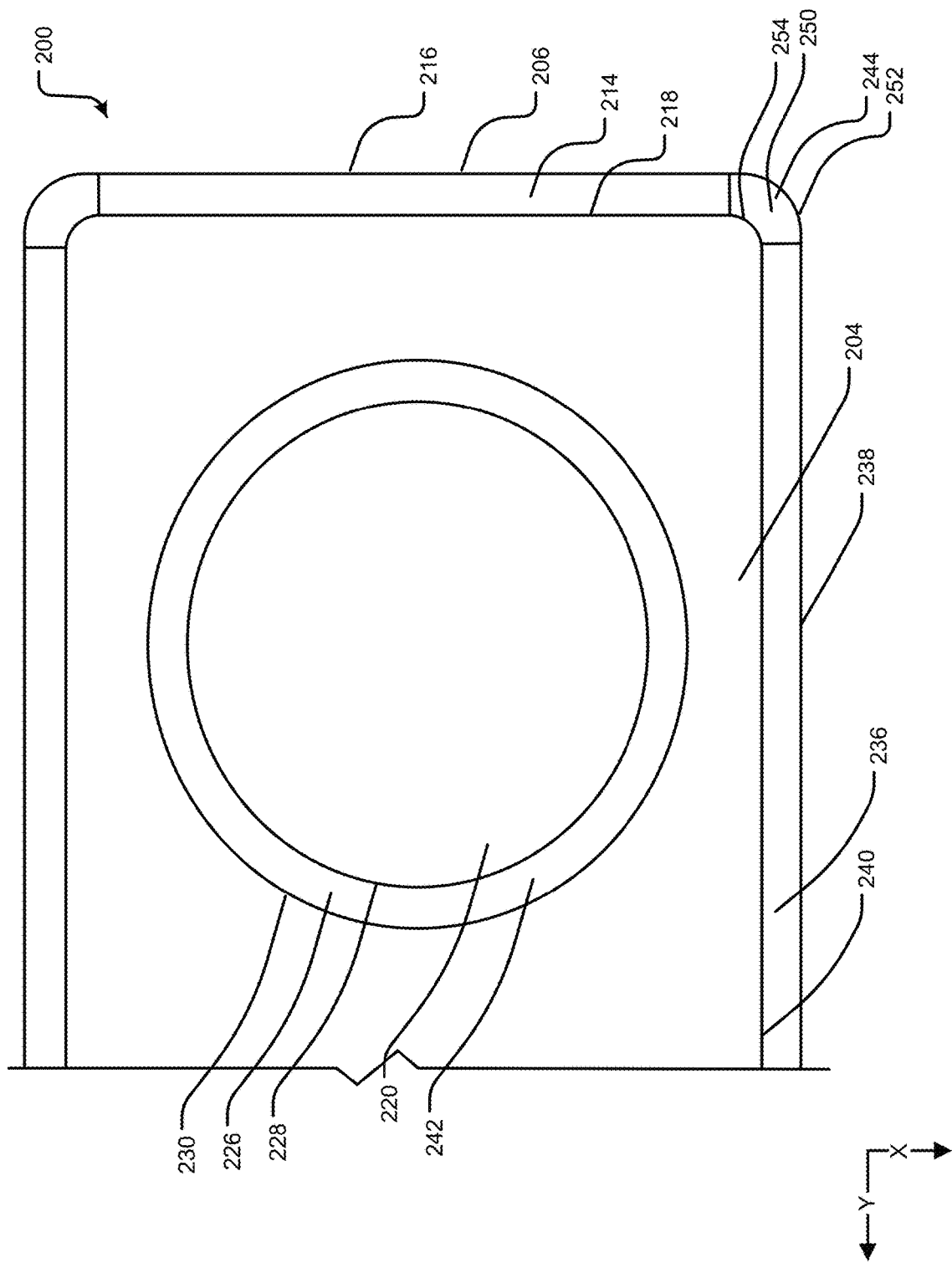
FIG. 4 illustrates a bottom view of the exemplary terminal according to FIG. 2.

FIG. 4 illustrates a bottom view of the exemplary terminal according to FIG. 2.

Figure 5:
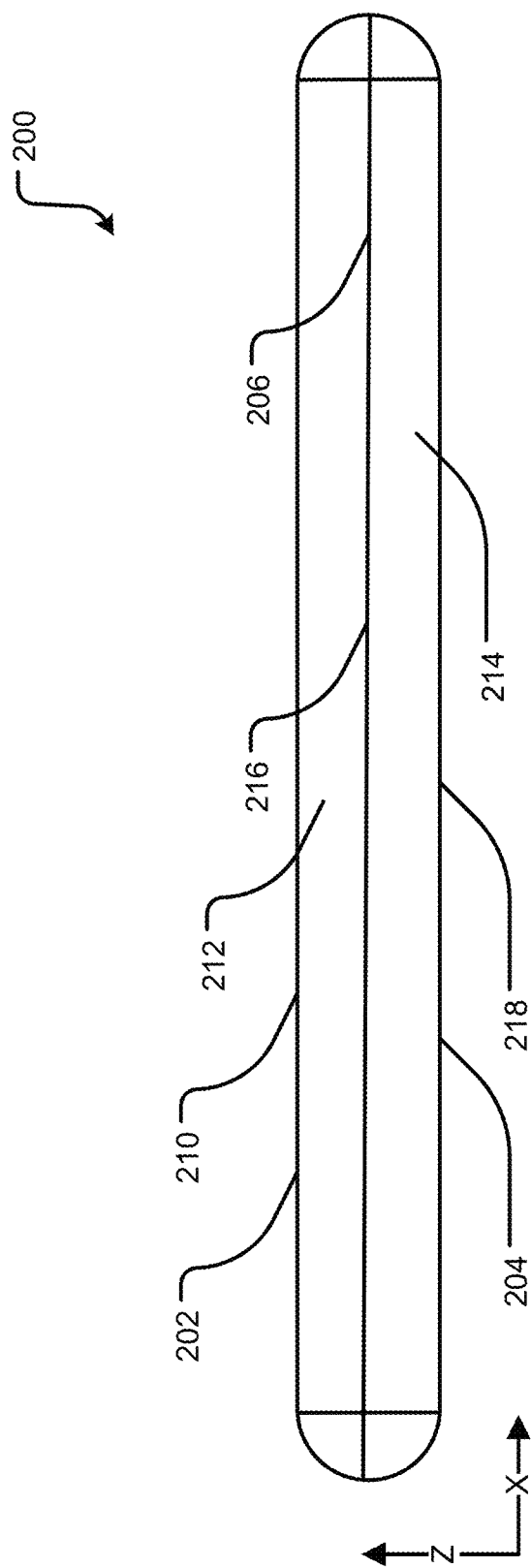
FIG. 5 illustrates an end view of the exemplary terminal according to FIG. 2.

FIG. 5 illustrates an end view of the exemplary terminal according to FIG. 2.

Figure 6:
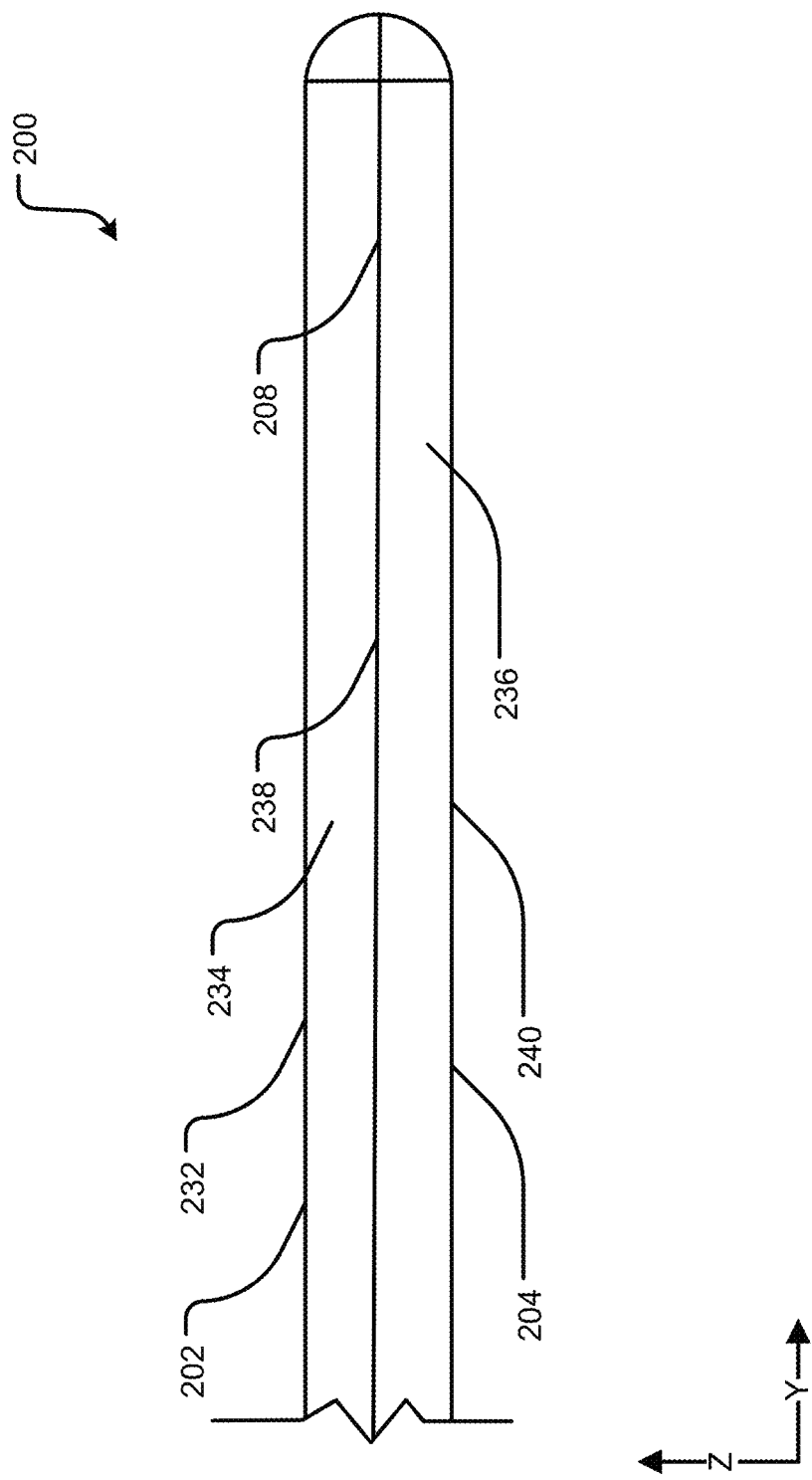
FIG. 6 illustrates a side view of the exemplary terminal according to FIG. 2.

FIG. 6 illustrates a side view of the exemplary terminal according to FIG. 2.

In particular, FIG. 2 illustrates the terminal 200 according to aspects of the disclosure. As described above, the terminal 200 may be implemented in the power module 100, the terminal 200 may be implemented in the bussing 900, the terminal 200 may be implemented in the application 700, the terminal 200 may be implemented in the DC link capacitors 102, the terminal 200 may be implemented in other components of the power system 300, and/or the like. The terminal 200 may include a first surface 202 and a second surface 204 (shown in FIG. 4, FIG. 5, and FIG. 6). The first surface 202 may be planar and may be generally arranged in a plane that is parallel to the X axis and the Y axis as illustrated in FIG. 2. In some aspects, the first surface 202 may be defined as a top surface of the terminal 200.

The second surface 204, which is obscured by the first surface 202 in FIG. 2, may be planar and may be generally arranged in a plane that is parallel to the X axis and the Y axis as illustrated in FIG. 4, FIG. 5, and FIG. 6. In some aspects, the second surface 204 may be defined as a bottom surface of the terminal 200. In one or more aspects, the first surface 202 and the second surface 204 may be parallel to each other. Moreover, the first surface 202 and the second surface 204 may be opposing sides of the terminal 200.

The terminal 200 may further include an end portion surface 206 and a side portion surface 208. The end portion surface 206 may be arranged on a portion of a perimeter of the terminal 200; and the side portion surface 208 may be arranged on another portion or portions of a perimeter of the terminal 200. In particular, the end portion surface 206 may be a terminating end portion of the terminal 200. The end portion surface 206 may extend from the first surface 202 to the second surface 204. In particular, the first surface 202 may extend across the terminal 200 as illustrated in FIG. 2 until it reaches the end portion surface 206. Thereafter, the end portion surface 206 may curve and extend from the first surface 202 to the second surface 204 as illustrated in FIG. 2 and FIG. 5.

In one or more aspects, the end portion surface 206 defines a surface that curves from the first surface 202 to the second surface 204. In one or more aspects, the end portion surface 206 defines a surface having a radius of curvature and forms a circular arc that curves from the first surface 202 to the second surface 204. In one or more aspects, the end portion surface 206 defines a surface having a cross-section that may be a partial circle, a partial ellipse, a partial parabola, a partial hyperbola, a partial squircle, and/or a partial superellipse.

In one or more aspects, the end portion surface 206 defines a surface that is tangent to the first surface 202 and curves from the first surface 202 to the second surface 204. In one or more aspects, the end portion surface 206 defines a surface that is tangent to the second surface 204 and curves from the second surface 204 to the first surface 202. In one or more aspects, the end portion surface 206 defines a surface that is tangent to the first surface 202 and is also tangent to the second surface 204, and the end portion surface 206 curves from the first surface 202 to the second surface 204.

In one or more aspects, the end portion surface 206 defines a surface having a cross-section that may not have any straight lines. In one or more aspects, the end portion surface 206 defines a surface having no flat portions. In one or more aspects, the end portion surface 206 defines a surface having a cross-section that may be a polygon having more than one side, more than two sides, and/or more than three sides. In one or more aspects, an angle between the end portion surface 206 and the first surface 202 at the end portion first edge 210 and an angle between the end portion surface 206 and the second surface 204 at the end portion second surface 214 may be less than 90°, less than 70° less than 50°, less than 30°, and/or less than 10°.

Figure 7:
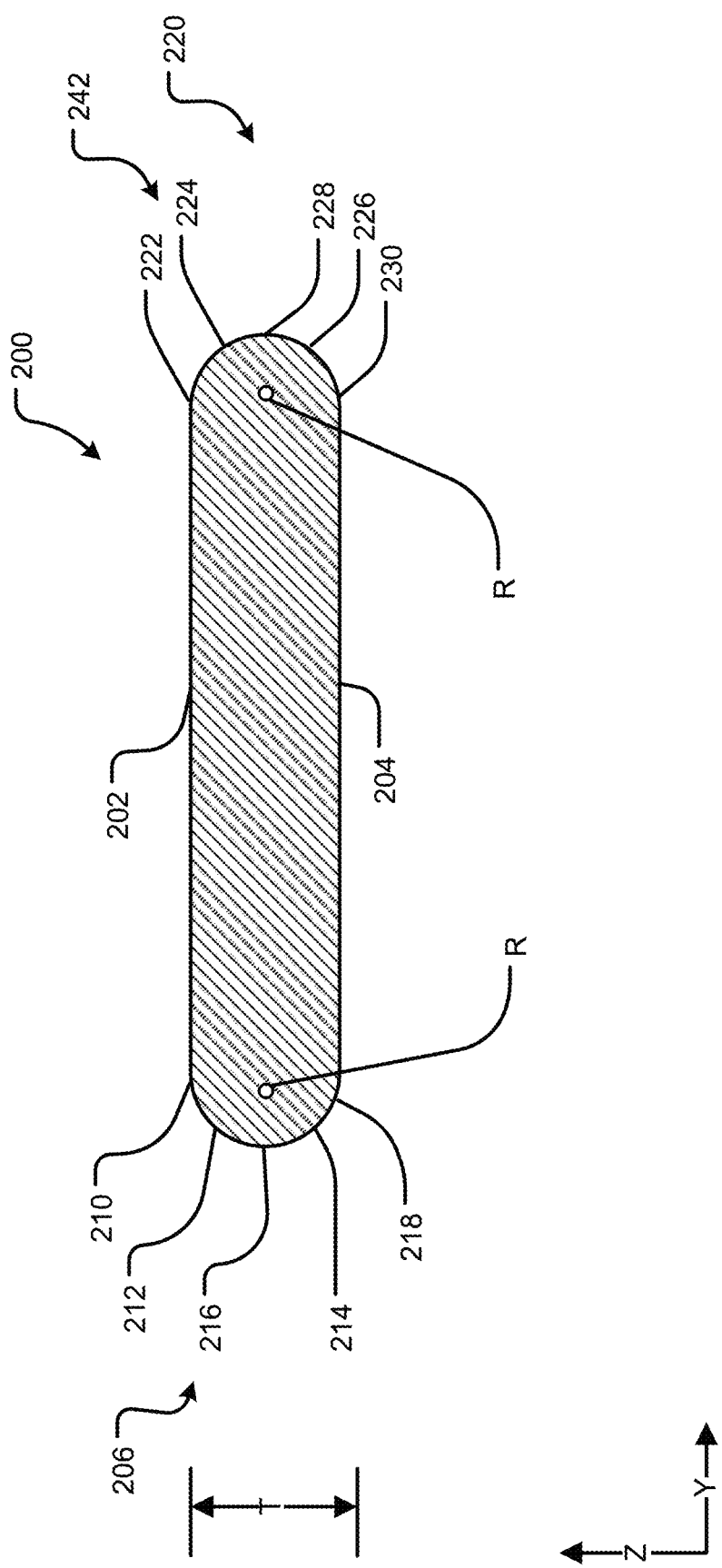
FIG. 7 illustrates a cross-sectional side view of the exemplary terminal according to FIG. 3 long lines VII-VII.

With reference to FIG. 2 and FIG. 5, the end portion surface 206 may include an end portion first edge 210, an end portion first surface 212, an end portion second surface 214, an end portion connecting portion 216, and an end portion second edge 218. In particular, the first surface 202 may extend across the terminal 200 until it reaches the end portion first edge 210. The end portion first edge 210 may be a point of transition between the first surface 202 and the end portion surface 206. At the end portion first edge 210, the end portion first surface 212 may start and may extend from the first surface 202 curving as it approaches the end portion connecting portion 216. The end portion connecting portion 216 may be a point of transition between the end portion first surface 212 and the end portion second surface 214. The end portion second surface 214 may extend toward the second surface 204 and may connect to the end portion second edge 218 as shown in FIG. 5 and FIG. 7.

The side portion surface 208 may extend from the first surface 202 to the second surface 204. In particular, the first surface 202 may extend across the terminal 200 as illustrated in FIG. 2 until it reaches the side portion surface 208. Thereafter, the side portion surface 208 may curve and extend from the first surface 202 to the second surface 204.

The side portion surface 208 may extend from the first surface 202 to the second surface 204. The surface of the side portion surface 208 may be generally parallel to the Y axis. Additionally, the side portion surface 208 may be arranged on multiple sides of the terminal 200.

In one or more aspects, the side portion surface 208 defines a surface that curves from the first surface 202 to the second surface 204. In one or more aspects, the side portion surface 208 defines a surface having a radius of curvature and forms a circular arc that curves from the first surface 202 to the second surface 204. In one or more aspects, the side portion surface 208 defines a surface having a cross-section that may be a partial circle, a partial ellipse, a partial parabola, a partial hyperbola, a partial squircle, and/or a partial superellipse.

In one or more aspects, the side portion surface 208 defines a surface that is tangent to the first surface 202 and curves from the first surface 202 to the second surface 204. In one or more aspects, the side portion surface 208 defines a surface that is tangent to the second surface 204 and curves from the second surface 204 to the first surface 202. In one or more aspects, the side portion surface 208 defines a surface that is tangent to the first surface 202 and is also tangent to the second surface 204, and the side portion surface 208 curves from the first surface 202 to the second surface 204.

In one or more aspects, the side portion surface 208 defines a surface having a cross-section that may not have any straight lines. In one or more aspects, the side portion surface 208 defines a surface having no flat portions. In one or more aspects, the side portion surface 208 defines a surface having a cross-section that may be a polygon having more than one side, more than two sides, and/or more than three sides. In one or more aspects, an angle between the side portion surface 208 and the first surface 202 at the side portion first edge 232 and an angle between the side portion surface 208 and the second surface 204 at the side portion second edge 240 may be less than 90°, less than 70° less than 50°, less than 30°, and/or less than 10°.

In particular, the first surface 202 may extend across the terminal 200 as illustrated in FIG. 2 until it reaches the side portion surface 208. Thereafter, the side portion surface 208 may curve from the first surface 202 to the second surface 204. The terminal 200 may include a first configuration of the side portion surface 208 along one length of the terminal 200; and the terminal 200 may include a second configuration of the side portion surface 208 along another length of the terminal 200 opposite the first configuration of the side portion surface 208. In other words, the terminal 200 may implement the side portion surface 208 on a first side of the terminal 200, a second side of the terminal 200, and/or the like.

Figure 8:
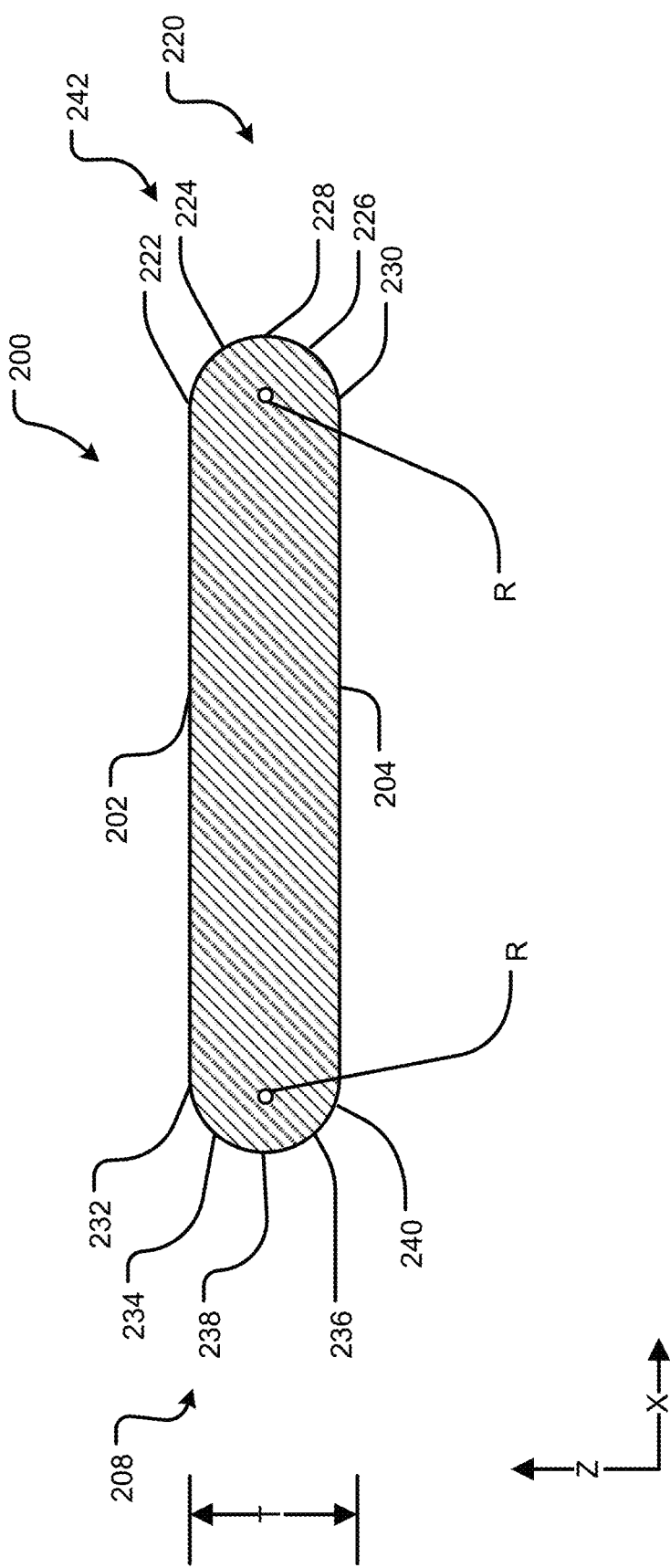
FIG. 8 illustrates a cross-sectional side view of the exemplary terminal according to FIG. 3 long lines VIII-VIII.

With reference to FIG. 2 and FIG. 5, the side portion surface 208 may include a side portion first edge 232, a side portion first surface 234, a side portion second surface 236, a side portion connecting portion 238, and a side portion second edge 240. In particular, the first surface 202 may extend across the terminal 200 until it reaches the side portion first edge 232. The side portion first edge 232 may be a point of transition between the first surface 202 and the side portion surface 208. At the side portion first edge 232, the side portion first surface 234 may start and may extend from the first surface 202 curving as it approaches the side portion connecting portion 238. The side portion connecting portion 238 may be a point of transition between the side portion first surface 234 and the side portion second surface 236. The side portion second surface 236 may extend toward the second surface 204 and may connect to the side portion second edge 240 as shown in FIG. 6 and FIG. 8.

The terminal 200 may further include a corner surface 244. In particular, the corner surface 244 may extend from the first surface 202 to the second surface 204. In particular, the first surface 202 may extend across the terminal 200 as illustrated in FIG. 2 until it reaches the corner surface 244. Thereafter, the corner surface 244 may curve and extend from the first surface 202 to the second surface 204. Additionally, the corner surface 244 may extend from the side portion surface 208 to the end portion surface 206.

With reference to FIG. 2, the corner surface 244 may include a corner portion first edge 246, a corner portion first surface 248, a corner portion second surface 250, a corner portion connecting portion 252, and a corner portion second edge 254 (shown in FIG. 4). In particular, the first surface 202 may extend across the terminal 200 until it reaches the corner portion first edge 246. The corner portion first edge 246 may be a point of transition between the first surface 202 and the corner surface 244. At the corner portion first edge 246, the corner portion first surface 248 may start and may extend from the first surface 202 curving as it approaches the corner portion connecting portion 252. The corner portion connecting portion 252 may be a point of transition between the corner portion first surface 248 and the corner portion second surface 250. The corner portion second surface 250 may extend toward the second surface 204 and may connect to the corner portion second edge 254 as shown in FIG. 4.

In one or more aspects, the corner surface 244 defines a surface that curves from the first surface 202 to the second surface 204. In one or more aspects, the corner surface 244 defines a surface having a radius of curvature and forms a circular arc that curves from the first surface 202 to the second surface 204. In one or more aspects, the corner surface 244 defines a surface having a cross-section that may be a partial circle, a partial ellipse, a partial parabola, a partial hyperbola, a partial squircle, and/or a partial superellipse.

In one or more aspects, the corner surface 244 defines a surface that is tangent to the first surface 202 and curves from the first surface 202 to the second surface 204. In one or more aspects, the corner surface 244 defines a surface that is tangent to the second surface 204 and curves from the second surface 204 to the first surface 202. In one or more aspects, the corner surface 244 defines a surface that is tangent to the first surface 202 and is also tangent to the second surface 204, and the corner surface 244 curves from the first surface 202 to the second surface 204.

In one or more aspects, the corner surface 244 defines a surface having a cross-section that may not have any straight lines. In one or more aspects, the corner surface 244 defines a surface having no flat portions. In one or more aspects, the corner surface 244 defines a surface having a cross-section that may be a polygon having more than one side, more than two sides, and/or more than three sides. In one or more aspects, an angle between the corner surface 244 and the first surface 202 at the corner portion first edge 246 and an angle between the corner surface 244 and the second surface 204 at the corner portion second edge 254 may be less than 90°, less than 70° less than 50°, less than 30°, and/or less than 10°.

In one or more aspects, the corner surface 244 defines a surface that curves from the side portion surface 208 to the end portion surface 206. In one or more aspects, the corner surface 244 defines a surface having a radius of curvature and forms a circular arc that curves from the side portion surface 208 to the end portion surface 206. In one or more aspects, the corner surface 244 defines a surface having a cross-section that may be a partial circle, a partial ellipse, a partial parabola, a partial hyperbola, a partial squircle, and/or a partial superellipse between the side portion surface 208 and the end portion surface 206 in a plane parallel to the Y axis and X axis.

In one or more aspects, the corner surface 244 defines a surface that is tangent to the side portion surface 208 and curves from the side portion surface 208 to the end portion surface 206. In one or more aspects, the corner surface 244 defines a surface that is tangent to the end portion surface 206 and curves from the end portion surface 206 to the side portion surface 208. In one or more aspects, the corner surface 244 defines a surface that is tangent to the end portion surface 206 and is also tangent to the side portion surface 208, and the corner surface 244 curves from the side portion surface 208 to the end portion surface 206.

Additionally, the terminal 200 may include an aperture 220 that may include an aperture surface 242 extending from the first surface 202 to the second surface 204. In particular, the first surface 202 may extend across the terminal 200 as illustrated in FIG. 2 until it reaches the aperture surface 242. Additionally, the first surface 202 may surround the aperture surface 242. Thereafter, the aperture surface 242 may curve and extend from the first surface 202 to the second surface 204. The aperture 220 of the terminal 200 may be configured to receive a mechanical fastener for electrically connecting the terminal 200 to another electrical component.

In one or more aspects, the aperture surface 242 defines a surface that curves from the first surface 202 to the second surface 204. In one or more aspects, the aperture surface 242 defines a surface having a radius of curvature and forms a circular arc that curves from the first surface 202 to the second surface 204. In one or more aspects, the aperture surface 242 defines a surface having a cross-section that may be a partial circle, a partial ellipse, a partial parabola, a partial hyperbola, a partial squircle, and/or a partial super-ellipse.

In one or more aspects, the aperture surface 242 defines a surface that is tangent to the first surface 202 and curves from the first surface 202 to the second surface 204. In one or more aspects, the aperture surface 242 defines a surface that is tangent to the second surface 204 and curves from the second surface 204 to the first surface 202. In one or more aspects, the aperture surface 242 defines a surface that is tangent to the first surface 202 and is also tangent to the second surface 204, and the aperture surface 242 curves from the first surface 202 to the second surface 204.

In one or more aspects, the aperture surface 242 defines a surface having a cross-section that may not have any straight lines. In one or more aspects, the aperture surface 242 defines a surface having no flat portions. In one or more aspects, the aperture surface 242 defines a surface having a cross-section that may be a polygon having more than one side, more than two sides, and/or more than three sides. In one or more aspects, an angle between the aperture surface 242 and the first surface 202 and an angle between the aperture surface 242 and the second surface 204 may be less than 90°, less than 70° less than 50°, less than 30°, and/or less than 10°.

The aperture surface 242 may include an aperture portion first edge 222, an aperture portion first surface 224, an aperture portion second surface 226, an aperture portion connecting portion 228, and an aperture portion second edge 230 (shown in FIG. 4).

In one or more aspects, the aperture surface 242 defines a surface that curves from the first surface 202 to the second surface 204. In one or more aspects, the aperture surface 242 defines a surface having a radius of curvature and forms a circular arc that curves from the first surface 202 to the second surface 204. In one or more aspects, the aperture surface 242 defines a surface having a cross-section that may be a partial circle, a partial ellipse, a partial parabola, a partial hyperbola, a partial squircle, and/or a partial super-ellipse.

In one or more aspects, the aperture surface 242 defines a surface that is tangent to the first surface 202 and curves from the first surface 202 to the second surface 204. In one or more aspects, the aperture surface 242 defines a surface that is tangent to the second surface 204 and curves from the second surface 204 to the first surface 202. In one or more aspects, the aperture surface 242 defines a surface that is tangent to the first surface 202 and is also tangent to the second surface 204, and the aperture surface 242 curves from the first surface 202 to the second surface 204.

FIG. 7 illustrates a cross-sectional side view of the exemplary terminal according to FIG. 3 long lines VII-VII.

In particular, FIG. 7 illustrates a cross-sectional side view of the end portion surface 206 of the terminal 200 as well as a cross-sectional view of the aperture surface 242 of the terminal 200. In particular, as noted in FIG. 7, the end portion surface 206 has a cross-section that is a partial circle extending from the end portion first edge 210 of the first surface 202 down to the end portion second edge 218 of the second surface 204. The partial circle of the end portion surface 206 may have a radius located at R. Moreover, the terminal 200 may have a thickness T between the first surface 202 and the second surface 204. Accordingly, the radius of the circle of the end portion surface 206 may be one half the thickness T.

Likewise, the aperture surface 242 may have a cross-section that may be a partial circle extending from the aperture portion first edge 222 of the first surface 202 down to the aperture portion second edge 230 of the second surface 204. The partial circle of the aperture surface 242 may have a radius located at R. Moreover, the terminal 200 may have a thickness T between the first surface 202 and the second surface 204. Accordingly, the radius of the circle of the aperture surface 242 may be one half the thickness T.

FIG. 8 illustrates a cross-sectional side view of the exemplary terminal according to FIG. 3 long lines VIII-VIII.

In particular, FIG. 8 illustrates a cross-sectional side view of the side portion surface 208 of the terminal 200 as well as a cross-sectional view of the aperture surface 242 of the terminal 200. In particular, as noted in FIG. 8, the side portion surface 208 has a cross-section that is a partial circle extending from the side portion first edge 232 of the first surface 202 down to the side portion second edge 240 of the second surface 204. The partial circle of the side portion surface 208 may have a radius located at R. Moreover, the terminal 200 may have a thickness T between the first surface 202 and the second surface 204. Accordingly, the radius of the circle of the side portion surface 208 may be one half the thickness T.

Figure 9:
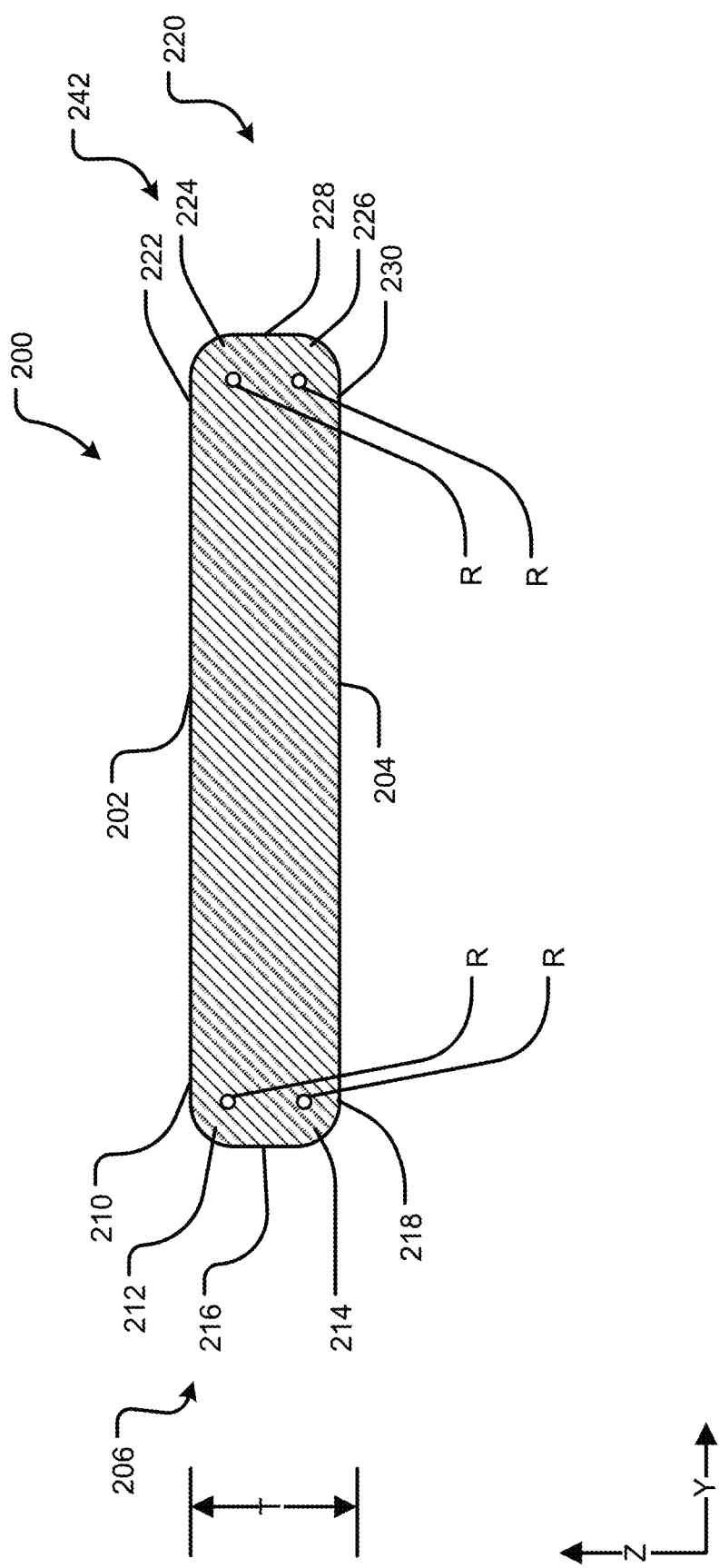
FIG. 9 illustrates a cross-sectional side view of another exemplary terminal.

FIG. 9 illustrates a cross-sectional side view of another exemplary terminal.

In particular, FIG. 9 illustrates a cross-sectional side view of the end portion surface 206 of the terminal 200 as well as a cross-sectional view of the aperture surface 242 of the terminal 200. In particular, as noted in FIG. 9, the end portion surface 206 has a cross-section that is a partial squircle extending from the end portion first edge 210 of the first surface 202 down to the end portion second edge 218 of the second surface 204. The partial squircle of the end portion surface 206 may have a radius located at R for the end portion first surface 212 and the end portion second edge 218. Moreover, the terminal 200 may have a thickness T between the first surface 202 and the second surface 204. Accordingly, the radius of the partial squircle of the end portion first surface 212 and the end portion second surface 214 may be 10%-20%, 20%-30%, 30%-40%, or 40%-50% the thickness T.

Likewise, the aperture surface 242 may have a cross-section that may be a partial squircle extending from the aperture portion first edge 222 of the first surface 202 down to the aperture portion second edge 230 of the second surface 204. The partial squircle of the aperture surface 242 may have a radius located at R for the aperture portion first surface 224 and the aperture portion second surface 226. Moreover, the terminal 200 may have a thickness T between the first surface 202 and the second surface 204. Accordingly, the radius of the partial squircle of the aperture portion first surface 224 and the aperture portion second surface 226 may be 10%-20%, 20%-30%, 30%-40%, or 40%-50% the thickness T. Additionally, the end portion connecting portion 216 and the aperture portion connecting portion 228 may include a flat surface portion.

Figure 10:
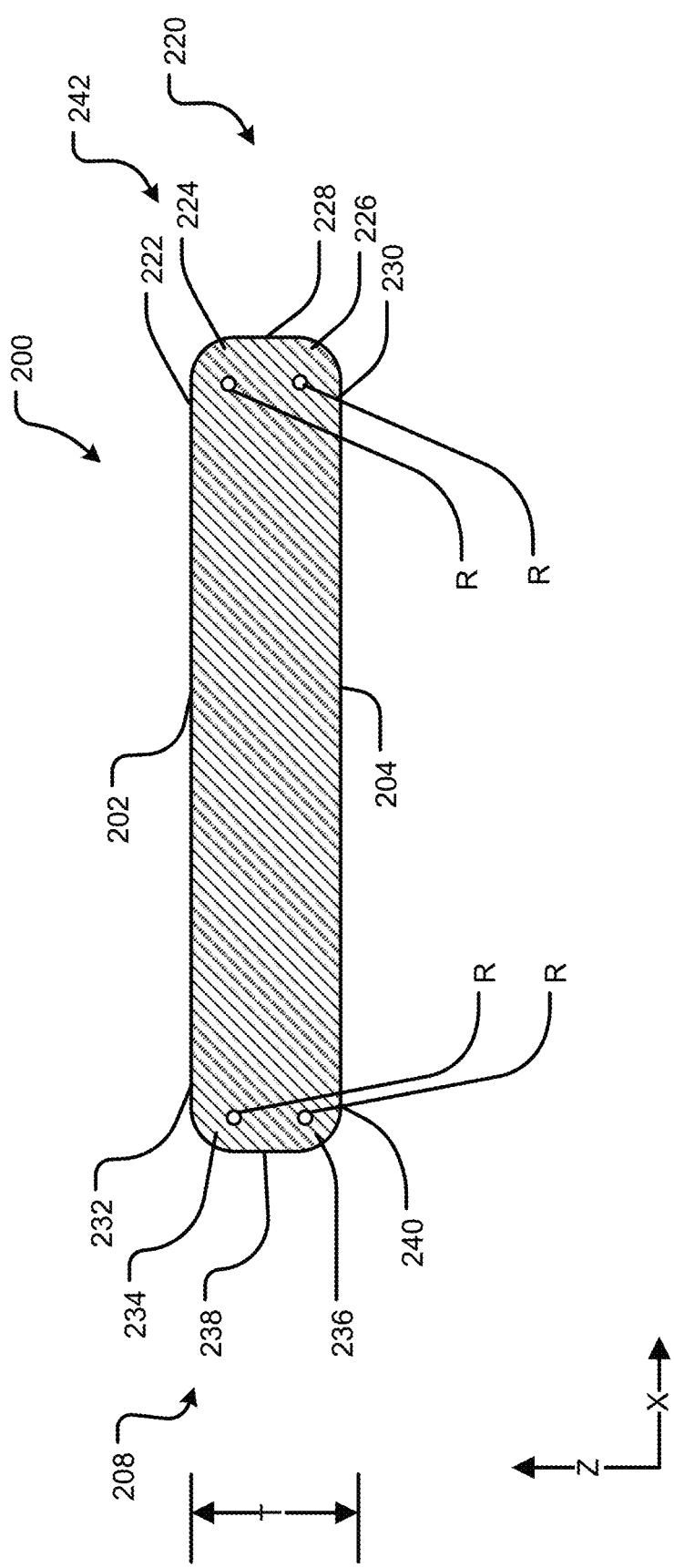
FIG. 10 illustrates a cross-sectional side view of another exemplary terminal.

FIG. 10 illustrates a cross-sectional side view of another exemplary terminal.

In particular, FIG. 10 illustrates a cross-sectional side view of the side portion surface 208 of the terminal 200. In particular, as noted in FIG. 10, the side portion surface 208 has a cross-section that is a partial squircle extending from the side portion first edge 232 of the first surface 202 down to the side portion second edge 240 of the second surface 204. The partial squircle of the side portion surface 208 may have a radius located at R for the side portion first surface 234 and the side portion second surface 236. Moreover, the terminal 200 may have a thickness T between the first surface 202 and the second surface 204. Accordingly, the radius of the partial squircle of the side portion first surface 234 and the side portion second surface 236 may be 10%-20%, 20%-30%, 30%-40%, or 40%-50% the thickness T.

In other aspects, the terminal 200 may have a cross-section that is a partial parabola, a partial hyperbola, a partial superellipse, and/or the like extending from the first surface 202 down to the second surface 204. Moreover, the terminal 200 may have a thickness T between the first surface 202 and the second surface 204. Accordingly, the radius or part of the radius of the end portion first surface 212, the end portion second surface 214, the aperture portion first surface 224, the aperture portion second surface 226 the end portion first surface 212, and the end portion second surface 214 may be 10%-20%, 20%-30%, 30%-40%, 40%-50%, 50%-60%, 60%-70%, or 70%-80%, the thickness T.

In one or more aspects, it may be beneficial to maximize the curvature of the side portion surface 208, the end portion surface 206, and/or the aperture surface 242. However, a limiting factor for a maximum possible curvature may be one half the thickness T of the terminal 200. Several ways to increase the radius beyond this maximum value could be implemented. For example, the thickness may be increased for all or most parts of the terminal 200 to allow for a larger radius. In this regard, it is often desired for the terminal 200 to be thin due to reduced material cost, ease of bending, reduced weight, and so on. In particular, the metal may be made only as thick as required for maximum ampacity and mechanical strength of the terminal 200. However, if increasing a power component's inception voltage it may be important enough for a desired application, it could trump those other concerns. Another way to increase the radius of the side portion surface 208, the end portion surface 206, and/or the aperture surface 242 without increasing mass would be to construct a hollow terminal with most of the internal metal removed as illustrated in FIG. 11.

Figure 11:
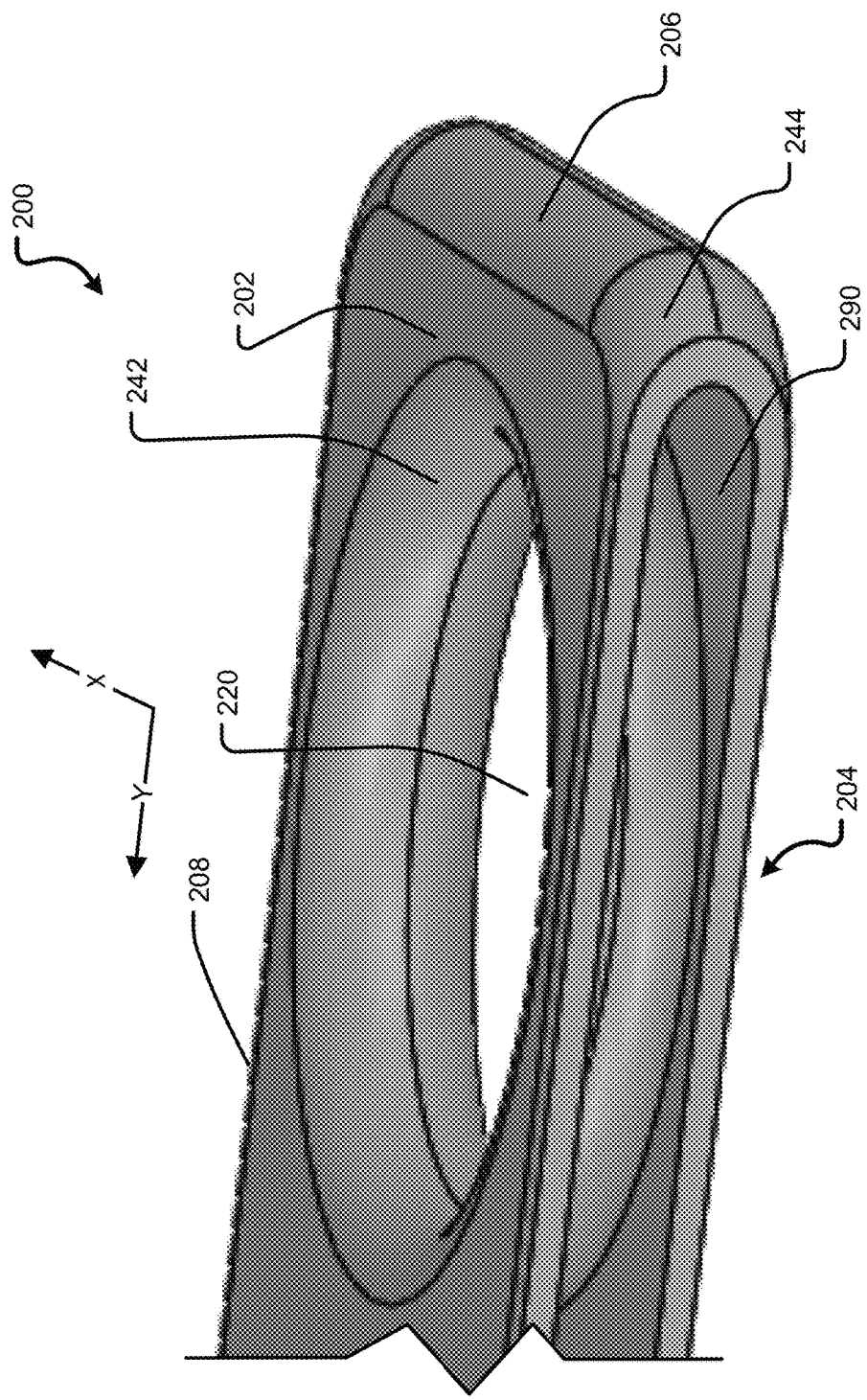
FIG. 11 illustrates a perspective cross-sectional view of another exemplary terminal according to aspects of the disclosure.

FIG. 11 illustrates a perspective cross-sectional view of another exemplary terminal according to aspects of the disclosure.

In particular, FIG. 11 illustrates an implementation of the terminal 200 that may include any one or more of the features of the terminal 200 as described herein. Moreover, the terminal 200 illustrated in FIG. 11 may be configured to increase the radius of the side portion surface 208, the end portion surface 206, and/or the aperture surface 242 without increasing mass with a hollow construction where a portion of internal metal removed to form a hollow portion 290. In this regard, FIG. 11 is a cross-sectional view with the side portion surface 208 not shown on one side to show the construction of the terminal 200 with the internal metal removed to form the hollow portion 290.

Figure 12:
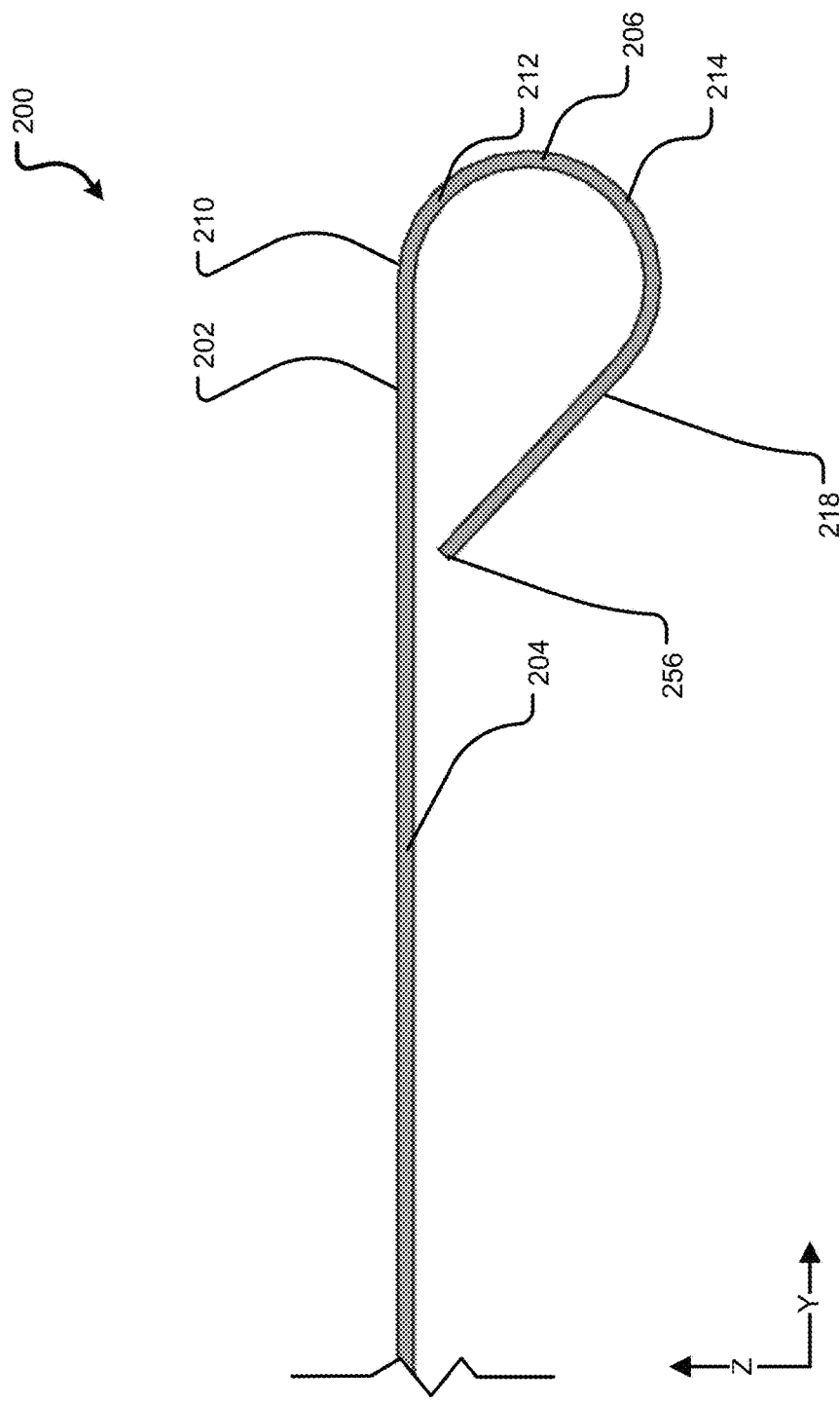
FIG. 12 illustrates a cross-sectional view of an end portion of another exemplary terminal according to the disclosure.

FIG. 12 illustrates a cross-sectional view of an end portion of another exemplary terminal according to the disclosure.

Figure 13:
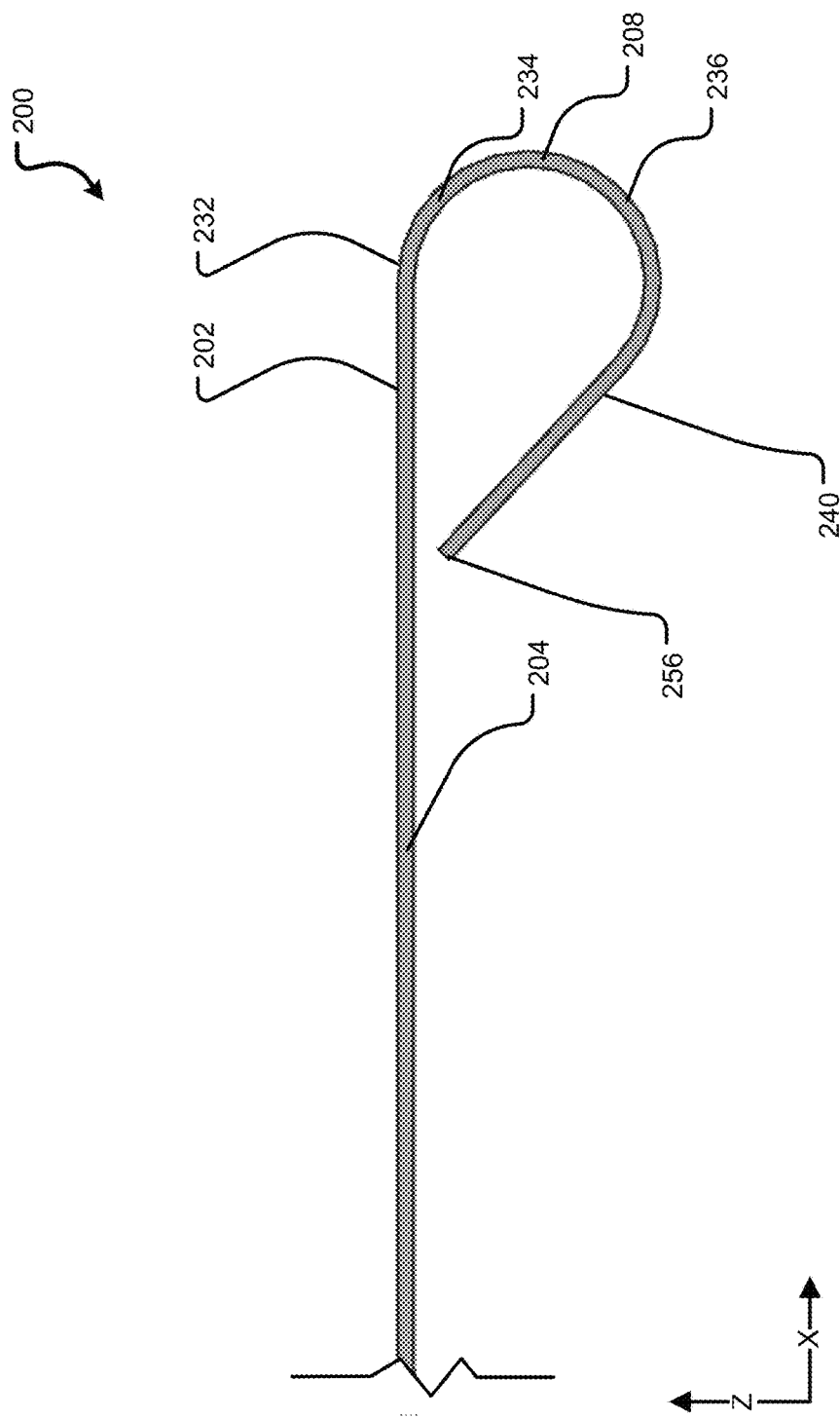
FIG. 13 illustrates a cross-sectional view of a side portion of the terminal according to FIG. 12.

FIG. 13 illustrates a cross-sectional view of a side portion of the terminal according to FIG. 12.

In particular, FIG. 12 and FIG. 13 illustrate a configuration of the terminal 200 that may be implemented with thinner metal parts in comparison to the terminal 200 illustrated in FIG. 2. In certain aspects, the terminal 200 illustrated in FIG. 12 and FIG. 13 may likely be more manufacturable, may be less expensive, and/or may use less material. In one or more aspects, the terminal 200 illustrated in FIG. 12 and FIG. 13 may be formed by a process to roll an edge 256 of the end portion surface 206 and/or the side portion surface 208 inward toward the second surface 204 after formation of an intermediate shape of the terminal 200. In this regard, the terminal 200 illustrated in FIG. 12 and FIG. 13 is a configuration such that the edge 256 may be pointed back inward toward the terminal 200 itself and may all have a far smaller impact on partial discharge inception voltage. Moreover, this construction may improve partial discharge performance, reduce partial discharge, increase an inception voltage of a partial discharge, reduce a strength of an electric field near the edges and/or corners, and/or the like.

In one or more aspects, the terminal 200 may be formed of a conductive material, a metal material such as copper aluminum, gold, nickel, cobalt, combinations thereof, and alloys thereof, and/or the like. Additionally, the terminal 200 may include various forming processes, metalworking processes, and the like in order to be structured and arranged consistent with the disclosure and/or figures in order to obtain a large radius outer edge, limiting a sharpness of flat edges, and/or the like as described herein. Additionally, the terminal 200 may include various forming processes, metalworking processes, and/or the like in order to be structured and arranged to have a partial discharge inception voltage rating higher than an otherwise identical terminal, enable an implementation of power systems having tighter spacings, achieve a smaller power component size, lower inductances, increase power density, and/or the like without an accompanying increase in the partial discharge inception voltage.

Additionally, the terminal 200 may include various forming processes, metalworking processes, and/or the like in order to be structured and arranged to have to improve partial discharge performance, reduce partial discharge, increase an inception voltage of a partial discharge, reduce a strength of an electric field near the edges and/or corners, and/or the like.

The terminal 200 may formed by various forming processes, metalworking processes, and/or that may include plastic deformation, rolling—where the material is passed through a pair of rollers, extrusion—where the material is pushed through an orifice, die forming—where the material is stamped by a press around or onto a die, forging—where the material is shaped by localized compressive forces, indenting—where a tool is pressed into the workpiece, stretching—where a tensile load is applied along the longitudinal axis of the workpiece, expanding—where the circumference of a hollow body is increased by tangential loading, recessing—where depressions and holes are formed through tensile loading, pulling through a die, deep drawing, spinning, flange forming, upset bulging, bending, shearing, cutting, punching, stamping, etching, and/or the like. The terminal 200 may formed by various forming processes, metalworking processes, and/or like that may include molding, forging, three-dimensional printing, and/or the like.

The terminal 200 may formed by various forming processes, metalworking processes, and/or like that may include starting materials that include flat components, cylindrical components, spherical components, partly spherical components, and/or other rounded shapes. The terminal 200 may formed by various forming processes, metalworking processes, and/or like for reducing electric field concentration.

All manner of deep draw techniques and other metal forming schemes could be applied toward the goal of large radius outer edges of the terminal 200. Additionally, the terminal 200 may formed by various forming processes, metalworking processes, and/or like that form the side portion surface 208, the aperture surface 242, and/or the end portion surface 206 as described herein. Additionally, the terminal 200, the side portion surface 208, the aperture surface 242, and/or the end portion surface 206 may include various deburring processes, polishing process, and/or the like to reduce or minimize sharp edges, rough surfaces, and/or the like as well as improve partial discharge performance, reduce partial discharge, increase an inception voltage of a partial discharge, reduce a strength of an electric field near the edges and/or corners, and/or the like.

The deburring processes may include manual deburring, electrochemical deburring, thermal energy deburring, cryogenic deburring, mechanical deburring, and/or the like. The polishing processes may include one or more of burnishing, mass finishing, tumble finishing, vibratory finishing, sodablasting, chemical-mechanical polishing, flame polishing, paste polishing, vapor polishing, and/or the like.

Figure 14:
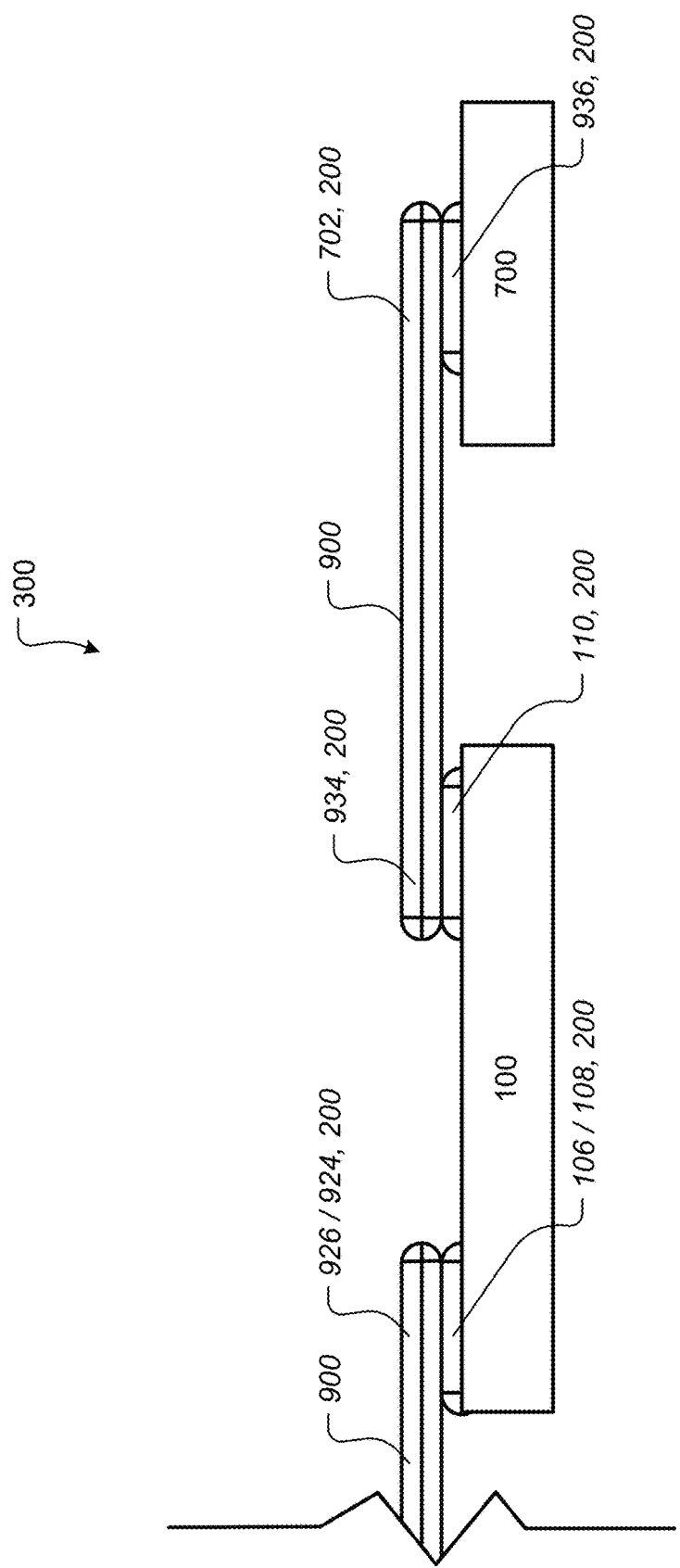
FIG. 14 illustrates an exemplary power system implementing a power component according to aspects of the disclosure.

FIG. 14 illustrates an exemplary power system implementing a power component according to aspects of the disclosure.

In particular, FIG. 14 illustrates the power system 300 that may include the power module 100, one or more implementations of the terminal 200. The terminal 200 as disclosed herein is structured and/or configured to improve partial discharge performance, reduce partial discharge, increase an inception voltage of a partial discharge, reduce a strength of an electric field near the edges and/or corners, and/or the like. The terminal 200 of the power module 100 may include, for example, a first terminal 106, a second terminal 108, a third terminal 110, and/or the like.

Additionally, the power system 300 may include the bussing 900 that includes one or more implementations of the terminal 200 that as disclosed herein is structured and/or configured to improve partial discharge performance, reduce partial discharge, increase an inception voltage of a partial discharge, reduce a strength of an electric field near the edges and/or corners, and/or the like. For example, the terminal 200 of the bussing 900 may be implemented as a first buss bar terminal 926, a second buss bar terminal 924, a third buss bar terminal 934, a fourth buss bar terminal 920, a fifth buss bar terminal 922, a sixth buss bar terminal 936, and/or the like. However, the bussing 900 may include any number of the terminal 200.

As further illustrated in FIG. 14, the first terminal 106 of the power module 100 may connect to the first buss bar terminal 926 of the bussing 900; the second terminal 108 of the power module 100 may connect to the second buss bar terminal 924 of the bussing 900; and the third terminal 110 of the power module 100 may connect to the third buss bar terminal 934 of the bussing 900.

Additionally, the power system 300 may connect to the application 700 and/or may include the application 700. In one aspect, the application 700 may include one or more implementations of the terminal 200 that as disclosed herein is structured and/or configured to improve partial discharge performance, reduce partial discharge, increase an inception voltage of a partial discharge, reduce a strength of an electric field near the edges and/or corners, and/or the like. For example, the terminal 200 of the application 700 may be implemented as a terminal 702.

Figure 15A:
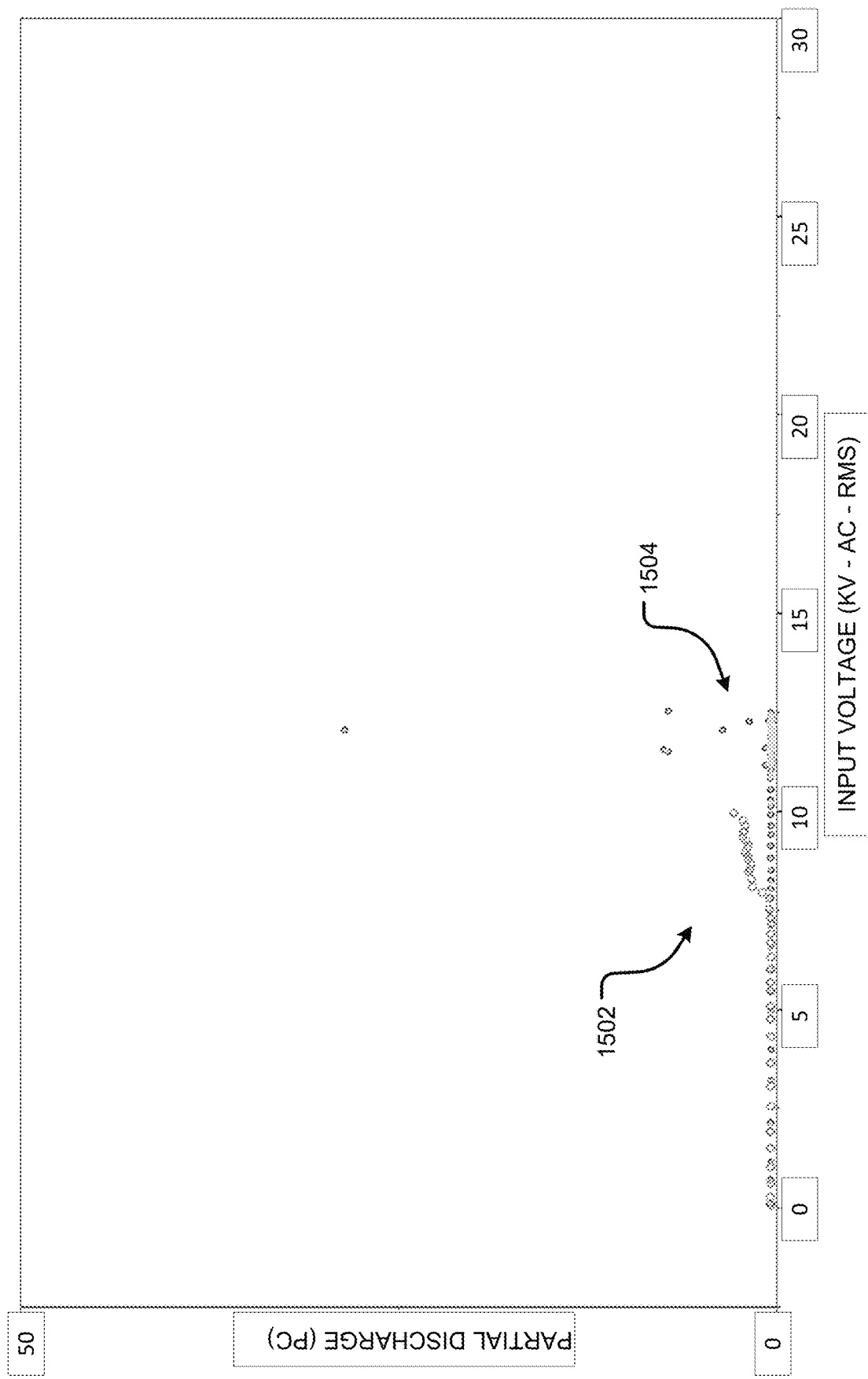
FIG. 15A, FIG. 15B, and FIG. 15C illustrate on one axis a partial discharge of power modules in pico coulomb (PC—SI unit of electric charge); and on another axis an input voltage kilovolts (KV)—Alternating Current (AC)—Root Mean Square (RMS).
Figure 15B:
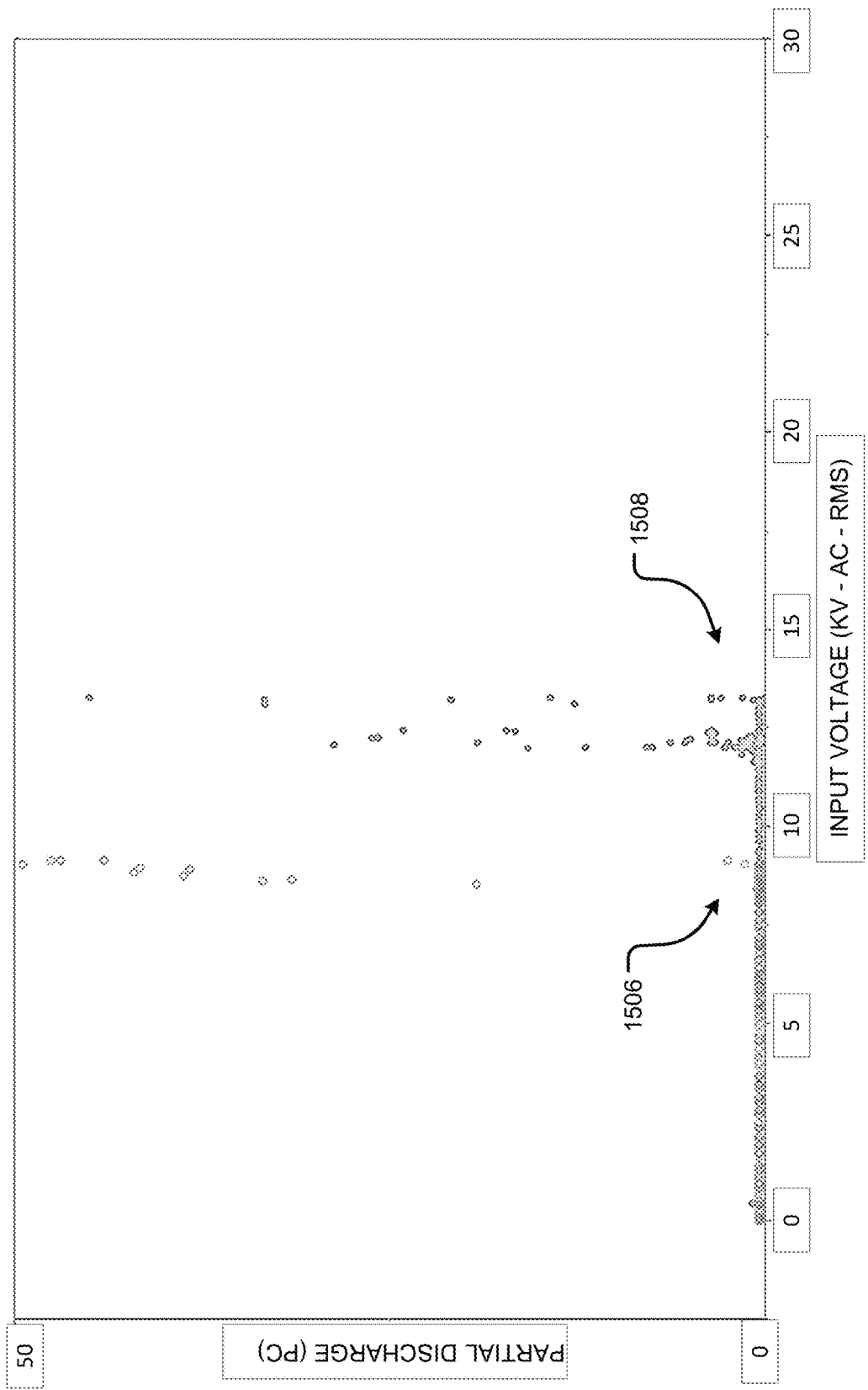
Figure 15C:
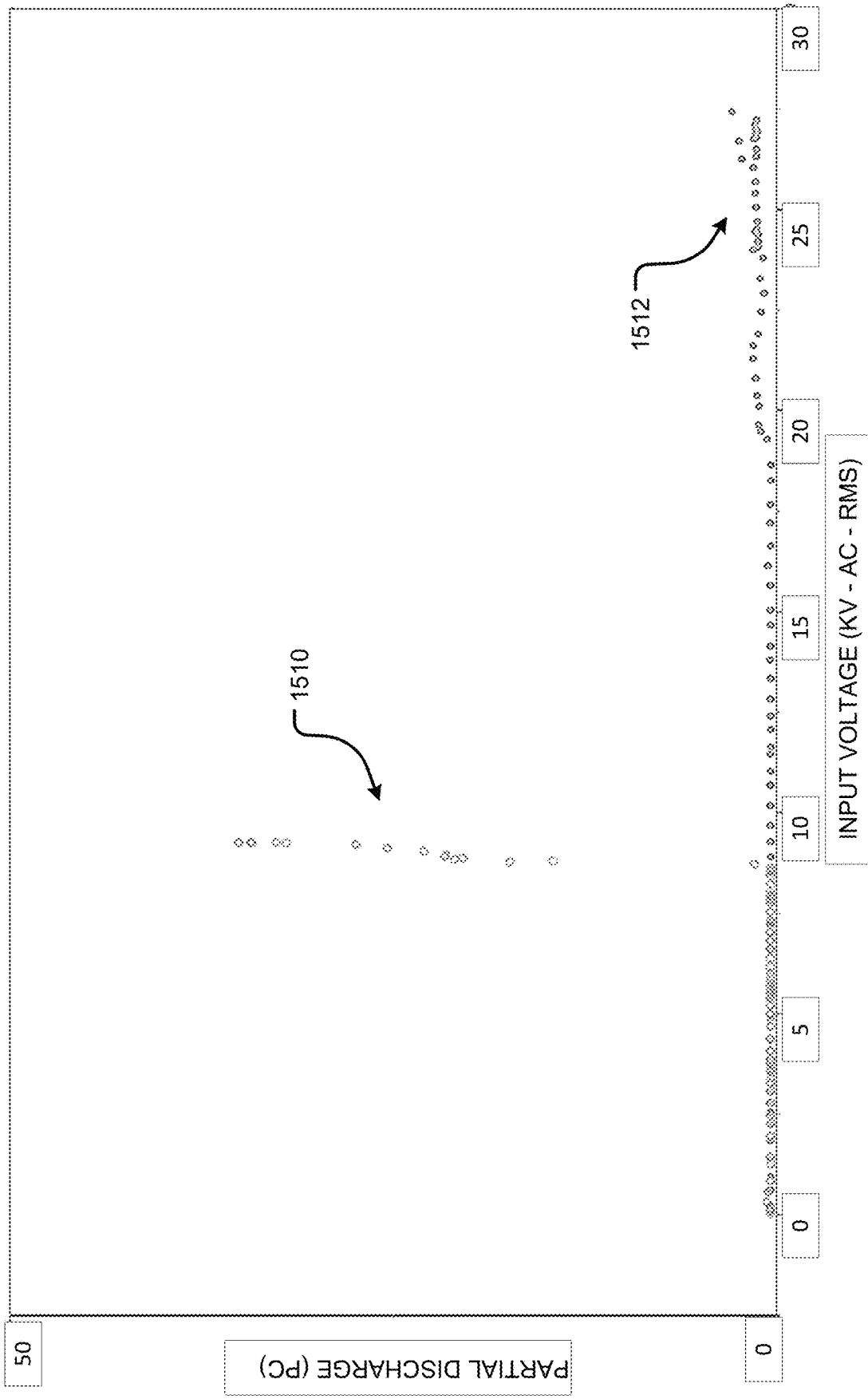

FIG. 15A, FIG. 15B, and FIG. 15C illustrate on one axis a partial discharge of power modules in pico coulomb (PC—SI unit of electric charge); and on another axis an input voltage kilovolts (KV)—Alternating Current (AC)—Root Mean Square (RMS).

FIG. 16 illustrates a table of a partial discharge performance for power modules implementing conventional terminals and power modules implementing terminals according to the disclosure.

In particular, FIG. 15A, FIG. 15B, FIG. 15C, and FIG. 16 illustrate the experimental data of a power module implementing conventional terminals; and experimental data illustrating impact of a power module implementing terminals according to the disclosure with deburring and/or polishing of the edges of the terminals (power contacts) according to the disclosure and the impact on the inception voltage of partial discharge. In particular, inception voltage of partial discharge for coplanar terminals (power contacts) as a function of round versus sharp edges.

FIG. 15A, FIG. 15B, and FIG. 15C illustrate on one axis a partial discharge of power modules in pico coulomb (PC—SI unit of electric charge); and on another axis an input voltage kilovolts (KV)—Alternating Current (AC)—Root Mean Square (RMS).

In particular, six different power modules were implemented. In particular, three of the power modules used conventional sharp edge terminals; and three of the power modules used round edge terminals in accordance to the disclosure.

More specifically, FIG. 15A illustrates inception voltage data 1502 for a power module with conventional sharp edge terminals and inception voltage data 1504 for a power module with round edge terminals in accordance to the disclosure having no dielectric fluid; FIG. 15B illustrates inception voltage data 1506 for a power module with conventional sharp edge terminals and inception voltage data 1508 for a power module with round edge terminals in accordance to the disclosure having 33% dielectric fluid; and FIG. 15C illustrates inception voltage data 1510 for a power module with conventional sharp edge terminals and inception voltage data 1512 for a power module with round edge terminals in accordance to the disclosure having 100% dielectric fluid. Each of the power modules was otherwise identical and had a 2.5 mm gap for the terminals.

FIG. 15A, FIG. 15B, FIG. 15C, and FIG. 16 illustrate that power modules with terminals according to the disclosure (Rounded edges) significantly decreases the partial discharge and increases the inception voltage of the partial discharge. More specifically, the inception voltage of the partial discharge was increased by 4.13 KV, 2.47 KV, and 18.7 KV respectively for each of the three sets of power modules as illustrated in FIG. 16. Moreover, the inception voltage of the partial discharge was increased 45%, 25%, and 213% respectively for each of the three sets of power modules implementing the terminals 200 according to the disclosure. Accordingly, the terminals 200 according to the disclosure may increase inception voltage of the partial discharge by 25%-75%, 75%-150%, and 150% to 225%. Additionally, the terminals 200 according to the disclosure may increase inception voltage of the partial discharge by more than 20%, 40%, 100%, or 200%. Additionally, the terminals 200 according to the disclosure may also increase inception voltage of the partial discharge in a similar manner for similar power modules, bussing, and/or applications.

Figure 17:
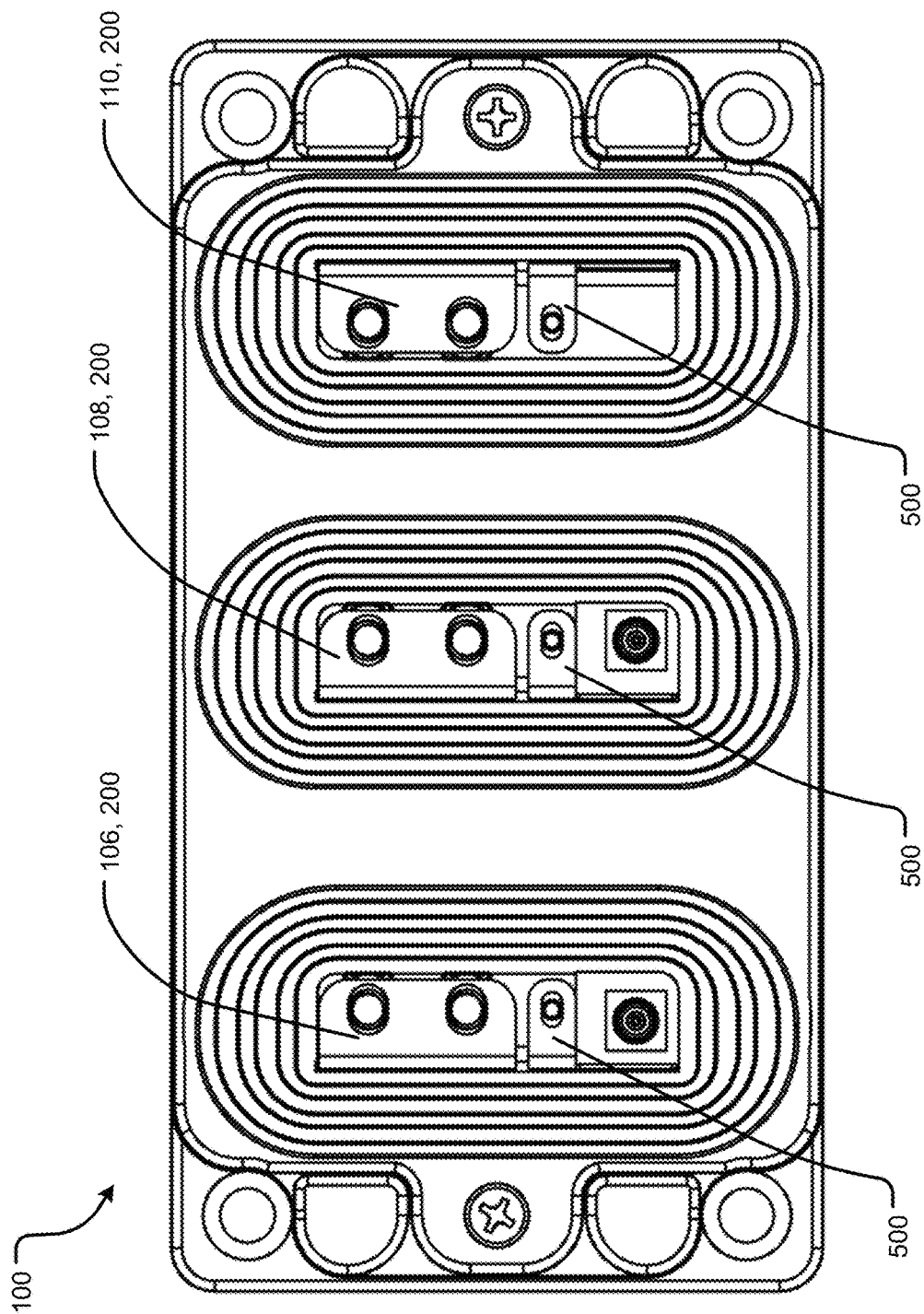
FIG. 17 illustrates a perspective schematic view of an exemplary power module according to an aspect of the disclosure.

FIG. 17 illustrates a perspective schematic view of an exemplary power module according to an aspect of the disclosure.

Figure 18:
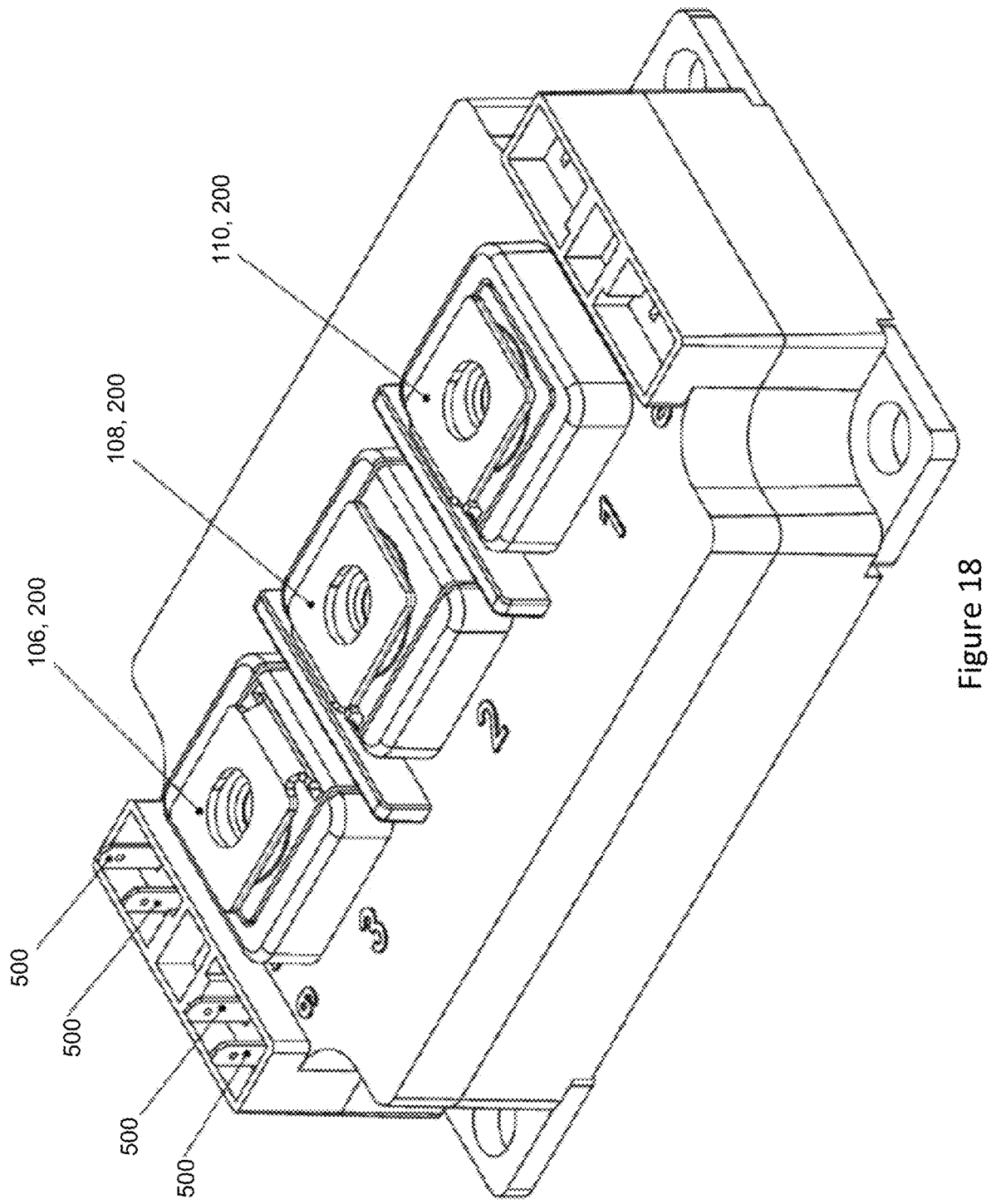
FIG. 18 illustrates a perspective schematic view of an exemplary power module according to an aspect of the disclosure.

FIG. 18 illustrates a perspective schematic view of an exemplary power module according to an aspect of the disclosure.

Figure 19:
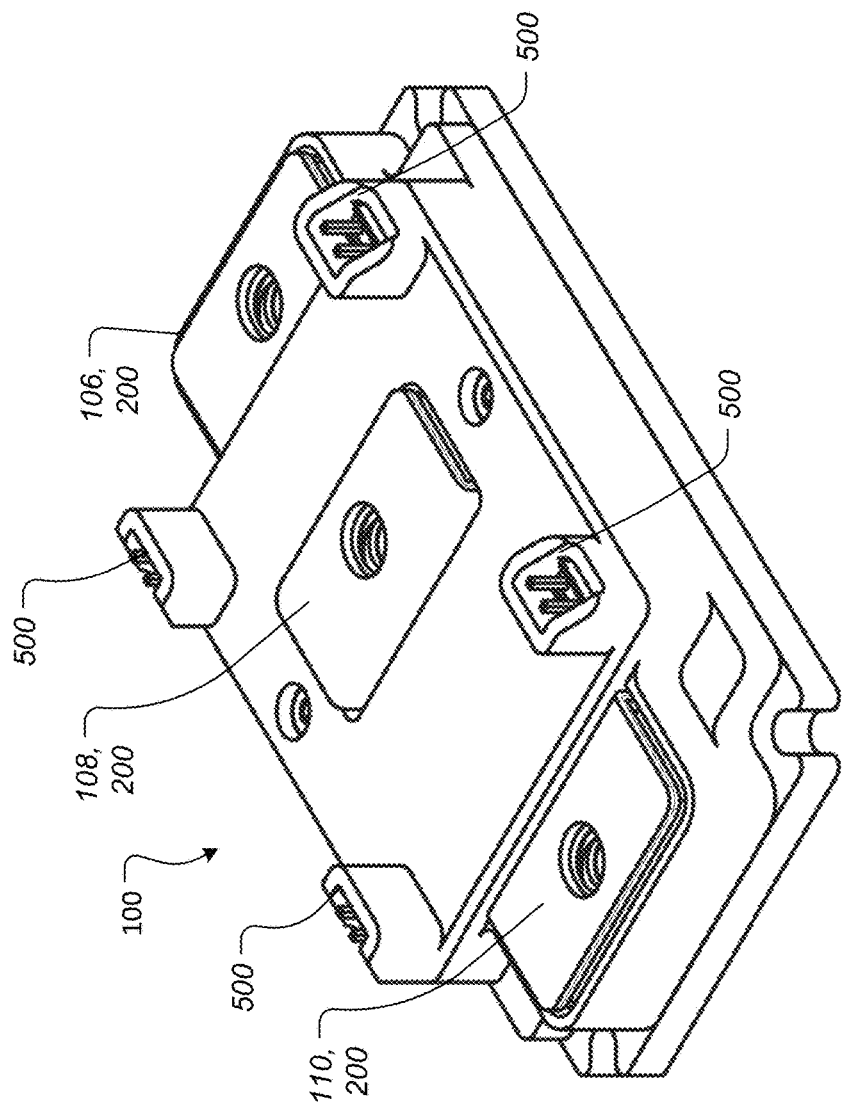
FIG. 19 illustrates a perspective schematic view of a power module according to an aspect of the disclosure.

FIG. 19 illustrates a perspective schematic view of a power module according to an aspect of the disclosure.

In particular, FIG. 17, FIG. 18, and FIG. 19, illustrate exemplary implementations of the power module 100 that may include the terminal 200 as disclosed herein structured and/or configured to improve partial discharge performance, reduce partial discharge, increase an inception voltage of a partial discharge, reduce a strength of an electric field near the edges and/or corners, and/or the like. The terminal 200 may include for example the first terminal 106, the second terminal 108, the third terminal 110, and/or the like. The power module of FIG. 17 may be constructed consistent with U.S. Pat. No. 10,448,524 issued Oct. 15, 2019 and incorporated by reference in its entirety; and the power module of FIG. 19 may be constructed consistent with United States publication patent number US 2020/0304037A1 published Sep. 3, 2019 and incorporated by reference in its entirety.

The power module 100 may include signal terminals 500. Each switch position 104 may utilize one or more of the signal terminals 500 for gate signals, source kelvin signals, and/or the like. Additionally, one or more of the signal terminals 500 may be used for one or more internal sensors, such as temperature sensors, current sensors, diagnostic sensors. The sensors may sense any physical characteristic, environmental characteristic, device characteristic, and/or the like.

In particular, the power modules may include a number of elements. These elements include one or more of a base plate, a gasket, one or more power substrates, one or more of the terminal 200, one or more switch positions 104, one or more temperature sensors, housing sidewalls, a signal interconnection assembly, a housing lid, fasteners, captive fasteners, and the like. In one aspect, the base plate may include a metal. In one aspect, the metal may include copper. Moreover, it is contemplated that the power module 100 may include fewer or different elements than those described herein.

The base plate may provide structural support to the power module 100 as well as facilitating heat spreading for thermal management of the power module 100. The base plate may include a base metal, such as copper, aluminum, or the like, or a metal matrix composite (MMC) which may provide coefficient of thermal expansion (CTE) matching to reduce thermally generated stress. In one aspect, the MMC material may be a composite of a high conductivity metal such as copper, aluminum, and the like, and either a low CTE metal such as molybdenum, beryllium, tungsten, and/or a nonmetal such as diamond, silicon carbide, beryllium oxide, graphite, embedded pyrolytic graphite, or the like. Depending on the material, the base plate may be formed by machining, casting, stamping, or the like. The base plate may have a metal plating, such as nickel, silver, gold and/or the like, to protect surfaces of the base plate and improve solder-ability. In one aspect, the base plate may have a flat backside. In one aspect, the base plate may have a convex profile to improve planarity after reflow. In one aspect, the base plate may have pin fins for direct cooling.

The gasket may improve an encapsulation process by providing a liquid tight seal. In this regard, the power module 100 may include dielectric encapsulation within. The gasket may be injection molded, dispensed, or the like, and may be applied in a groove in the housing sidewalls and compressed between the housing sidewalls and the base plate.

The power module 100 may include one or more power substrates. The one or more power substrates may provide electrical interconnection, voltage isolation, heat transfer, and the like for the power devices. The one or more power substrates may be constructed as a direct bond copper (DBC), an active metal braze (AMB), an insulated metal substrate (IMS), or the like. In the case of the IMS structure, the one or more power substrates and the base plate may be integrated as the same element. In some aspects, the one or more power substrates may be attached to the base plate with solder, thermally conductive epoxy, silver sintering or the like. In one aspect there may be two of the power substrates, one for each switch position 104.

The power module 100 may include one or more the terminal 200. A surface of one of the one or more terminal 200 may form the V+ terminal or first terminal 106. A surface of one of the one or more terminal 200 may form the phase terminal or third terminal 110. The one or more terminal 200 may create a high current path between an external system and the one or more power substrates. In one aspect, the one or more terminal 200 may be folded over the captive fastener. In one aspect, the one or more terminal 200 may be soldered, ultrasonically welded, or the like directly to the power substrate. The one or more terminal 200 may have a metal plating, such as nickel, silver, gold, and/or the like to protect the surfaces and improve solder-ability.

The power module 100 may further include one or more switch positions 104. The one or more switch positions 104 may include the power devices that may include any combination of controllable switches and diodes placed in parallel to meet requirements for current, voltage, and efficiency. The power devices may be attached with solder, conductive epoxy, a silver sintering material, or the like. The upper pads on the power devices, including the gate and the source, may be wire bonded to their respective locations with power wire bonds. The power wire bonds may include aluminum, an aluminum alloy, copper, or the like wires, which may be ultrasonically welded, or the like at both feet, forming a conductive arch between two metal pads. Signal bonds may be formed in a similar manner and may be aluminum, gold, copper, or the like. In some aspects, the diameter of the wire of the power wire bonds at may be smaller than the wire of the power wire bonds.

The signal interconnection assembly may be a gate-source board. The signal interconnection assembly may be a small signal circuit board facilitating electrical connection from the signal contacts to the power devices. The signal interconnection assembly may allow for gate and source kelvin connection, as well as connection to additional nodes or internal sensing elements. The signal interconnection assembly may allow for individual gate resistors for each of the power devices. The signal interconnection assembly may be a printed circuit board, ceramic circuit board, flex circuit board, embedded metal strips, or the like arranged in the housing sidewalls. In one aspect, the signal interconnection assembly may include a plurality of assemblies. In one aspect, the signal interconnection assembly may include a plurality of assemblies, one for each switch position 104.

The power module 100 may further include the captive fasteners. The captive fasteners may be hex nuts placed in the housing sidewalls and housing lid and may be held captive underneath the terminal 200. Other types of fasteners or connectors are contemplated to implement the captive fasteners. The captive fasteners may facilitate electrical connection to the bussing 900. The captive fasteners may be arranged such that when the power module 100 is bolted to the bussing 900, the captive fasteners and the terminal 200 are pulled upwards into the bussing 900, forming a better quality electrical connection.

The application 700 which may connect to, may include, and/or the like the power components, the power system 300, the power module 100, and/or the like may include a power system, a motor system, a motor drive, an automotive motor system, a charging system, an automotive charging system, a vehicle system, an industrial motor drive, an embedded motor drive, an uninterruptible power supply, an AC-DC power supply, a welder power supply, military systems, an inverter, an inverter for wind turbines, solar power panels, tidal power plants, electric vehicles (EVs), a converter, solar inverters, circuit breakers, protection circuits, DC-DC converters, Off-Board DC Fast Chargers for electric vehicles (EVs) and the like, on-board DC/DC Converters for electric vehicles (EVs) and the like, on-board battery chargers for electric vehicles (EVs) and the like, electric vehicle (EV) Powertrains/Main Inverters, electric vehicle (EV) charging infrastructures, electric traction motors, motor drives for electric motors, commercial inductive heating systems, uninterruptible power systems, and/or the like.

For example, the application 700 which may connect to, may include, and/or the like the power components, the power system 300, the power module 100, and/or the like may be implemented in electric vehicles (EVs) as an on-board DC/DC Converter which may be utilized for powering by diverse voltages—propulsion, HVAC, window lifts, lighting inside and out, infotainment, seat belt sensors, and/or the like. The on-board DC/DC Converter may convert and portion out a correct voltage to each in real time, enabling all systems to work as one.

As another example, the application 700 which may connect to, may include, and/or the like the power components, the power system 300, the power module 100, and/or the like may be implemented in electric vehicles (EVs) as an Off-Board DC Fast Charger. The off-board charger may convert incoming external alternating current (AC) to the direct current (DC) power mode required by the EV ecosystem and store it in a battery.

As another example, the application 700 which may connect to, may include, and/or the like the power components, the power system 300, the power module 100, and/or the like may be implemented in electric vehicles (EVs) as an On-Board Battery Charger that may convert DC power from the electric vehicle (EV) battery subsystem into AC power for the main drive motor of the electric vehicles (EVs). When the electric vehicles (EVs) is receiving external power from the grid, the device's rectifier circuitry may convert AC power into DC power to recharge the battery of the electric vehicles (EVs). The system may also harvest kinetic energy created by the momentum of the electric vehicle (EV) through regenerative braking and sends that to the battery as well.

As another example, the application 700 which may connect to, may include, and/or the like the power components, the power system 300, the power module 100, and/or the like may be implemented in electric vehicles (EVs) as an electric vehicle (EV) Powertrain/Main Inverter. In this regard, the electric vehicle (EV) powertrain may propel the electric vehicle (EV) in conjunction with the EV Powertrain/Main Inverter.

As another example, the application 700 which may connect to, may include, and/or the like the power components, the power system 300, the power module 100, and/or the like may be implemented in electric vehicle (EV) Charging Infrastructure for electric vehicle (EV) charging stations to deliver more power with lower losses.

As another example, the application 700 which may connect to, may include, and/or the like the power components, the power system 300, the power module 100, and/or the like may be implemented in an electric traction motor implemented in electric vehicles (EVs), locomotives, roller coasters, other types of transportation, and/or the like that may be configured to control by switching electrical current frequency and voltage and through manipulation of magnetic fields. Such systems may be smaller and lighter than existing systems.

As another example, the application 700 which may connect to, may include, and/or the like the power components, the power system 300, the power module 100, and/or the like may be implemented in a Motor Drive for Electric motors various transportation systems, factory robots, and the like that may achieve reduction in energy costs, run faster and cooler, and use less energy.

As another example, the application 700 which may connect to, may include, and/or the like the power components, the power system 300, the power module 100, and/or the like may be implemented in Commercial Inductive Heating system providing the ability to liquify metal, grow semiconductor crystals, ionize plasma, and/or the like by delivering extremely high current and high frequency power switched at exceptionally fast speeds with low conduction loss.

As another example, the application 700 which may connect to, may include, and/or the like the power components, the power system 300, the power module 100, and/or the like may be implemented in Uninterruptible Power Systems providing a reliable backup power source for any electronic system including standby battery backup power delivery, redundant, double-conversion UPS technologies, and the like that may allow zero transfer time, fewer switching losses, lower system costs, lower operating temperature, and/or the like.

Accordingly, the disclosure has also set forth an improved power component for the application 700, the power system 300, the power module 100, the bussing 900, and/or other associated system components having improved partial discharge performance in numerous topologies and applications as described herein. disclosure has also set forth an improved power component for the application 700, the power system 300, the power module 100, the bussing 900, and/or other associated system components structured and/or configured to improve partial discharge performance, reduce partial discharge, increase an inception voltage of a partial discharge, reduce a strength of an electric field near the edges and/or corners, and/or the like.

The following are a number of nonlimiting Examples of aspects of the disclosure.

One example includes a power component. The power component also includes at least one terminal that includes a first planar surface, a second planar surface opposite the first planar surface, and a curved surface extending from the first planar surface to the second planar surface. The power component also includes where the power component includes at least one of the following: a power module or a buss bar.

The above-noted Example may further include any one or a combination of more than one of the following aspects. The power component where: the at least one terminal includes a terminating end connected to the first planar surface and the second planar surface, and the terminating end includes the curved surface extending from the first planar surface to the second planar surface. The at least one terminal includes side surfaces extending from the first planar surface to the second planar surface, and the side surfaces each includes the curved surface extending from the first planar surface to the second planar surface. The at least one terminal includes an aperture defined by a curved surface extending from the first planar surface to the second planar surface. The at least one terminal includes a terminating end connected to the first planar surface and the second planar surface, the terminating end includes the curved surface extending from the first planar surface to the second planar surface, the at least one terminal includes side surfaces extending from the first planar surface to the second planar surface, the side surfaces each includes the curved surface extending from the first planar surface to the second planar surface, and the at least one terminal includes an aperture defined by a curved surface extending from the first planar surface to the second planar surface. The curved surface of the at least one terminal reduces an electric field strength. The curved surface of the at least one terminal increases an inception voltage of a partial discharge of the at least one terminal. The curved surface of the at least one terminal increases an inception voltage of a partial discharge of the at least one terminal by at least 20%. The curved surface of the at least one terminal increases an inception voltage of a partial discharge of the at least one terminal by at least 4 KV. The curved surface of the at least one terminal includes a radius of curvature that is 30% to 80% of a distance between the first planar surface and the second planar surface. A cross-section of the curved surface includes at least one of the following: a partial circle, a partial ellipse, a partial parabola, a partial hyperbola, a partial squircle, or a partial superellipse. The at least one terminal is implemented in the power component includes the power module and the power module includes at least one electrically conductive power substrate; a housing arranged on the at least one electrically conductive power substrate; a plurality of power devices arranged on and connected to the at least one electrically conductive power substrate; and a base plate, where the at least one terminal is electrically connected to the plurality of power devices. The at least one electrically conductive power substrate includes a metallic surface and/or a conductive surface supporting the plurality of power devices. The power system is configured as one of the following: an inverter, a power system, a motor system, a converter, and an ac-dc power supply. The at least one terminal is implemented in the power component that includes the buss bar.

One example includes a process for configuring a power component. The process also includes configuring at least one terminal with a first planar surface, a second planar surface opposite the first planar surface, and a curved surface extending from the first planar surface to the second planar surface. The process also includes implementing the at least one terminal in the power component and the power component includes at least one of the following: a power module or a buss bar.

The above-noted Example may further include any one or a combination of more than one of the following aspects. The process for configuring the power component includes polishing the first planar surface of the at least one terminal, the second planar surface of the at least one terminal, and/or the curved surface of the at least one terminal. The process for configuring the power component includes deburring the first planar surface of the at least one terminal, the second planar surface of the at least one terminal, and/or the curved surface of the at least one terminal. The process for configuring the power component includes configuring the at least one terminal with a terminating end connected to the first planar surface and the second planar surface, and configuring the terminating end with the curved surface extending from the first planar surface to the second planar surface. The side surfaces each includes the curved surface extending from the first planar surface to the second planar surface. The at least one terminal includes an aperture defined by a curved surface extending from the first planar surface to the second planar surface. The side surfaces each includes the curved surface extending from the first planar surface to the second planar surface; and where the at least one terminal includes an aperture defined by a curved surface extending from the first planar surface to the second planar surface. The curved surface of the at least one terminal reduces an electric field strength. The curved surface of the at least one terminal increases an inception voltage of a partial discharge of the at least one terminal. The curved surface of the at least one terminal increases an inception voltage of a partial discharge of the at least one terminal by at least 20%. The curved surface of the at least one terminal increases an inception voltage of a partial discharge of the at least one terminal by at least 4 KV. The curved surface of the at least one terminal includes a radius of curvature that is 30% to 80% of a distance between the first planar surface and the second planar surface. A cross-section of the curved surface includes at least one of the following: a partial circle, a partial ellipse, a partial parabola, a partial hyperbola, a partial squircle, or a partial superellipse. The at least one terminal is electrically connected to the plurality of power devices. The at least one electrically conductive power substrate includes a metallic surface and/or a conductive surface supporting the plurality of power devices. A process for configuring a power system includes the process for configuring the power component and includes configuring the power component in one of the following: an inverter, a power system, a motor system, a converter, and an ac-dc power supply. The process for configuring the power component includes implementing the at least one terminal in the power component that includes the buss bar.

One example includes a power module. The power module also includes at least one electrically conductive power substrate. The power module also includes a housing arranged on the at least one electrically conductive power substrate. The power module also includes at least one terminal that includes a first planar surface, a second planar surface opposite the first planar surface, and a curved surface extending from the first planar surface to the second planar surface. The power module also includes a plurality of power devices arranged on and connected to the at least one electrically conductive power substrate. The power module also includes a base plate. The power module also includes where the at least one terminal is electrically connected to the at least one electrically conductive power substrate.

The above-noted Example may further include any one or a combination of more than one of the following aspects. The power module where: the at least one terminal includes a terminating end connected to the first planar surface and the second planar surface, and the terminating end further includes the curved surface extending from the first planar surface to the second planar surface. The at least one terminal includes a terminating end connected to the first planar surface and the second planar surface, the at least one terminal includes side surfaces connected to the first planar surface and the second planar surface, and the terminating end and the side surfaces each includes the curved surface extending from the first planar surface to the second planar surface. The terminating end and the side surfaces are connected with a curved surface extending from the terminating end to the side surfaces. The at least one terminal includes an aperture defined by a curved surface extending from the first planar surface to the second planar surface. The at least one terminal includes a terminating end connected to the first planar surface and the second planar surface, the at least one terminal includes side surfaces connected to the first planar surface and the second planar surface, and the terminating end and the side surfaces each includes the curved surface extending from the first planar surface to the second planar surface. A cross-section of the curved surface includes at least one of the following: a partial circle, a partial ellipse, a partial parabola, a partial hyperbola, a partial squircle, or a partial superellipse. The curved surface of the at least one terminal reduces an electric field strength. The curved surface of the at least one terminal increases an inception voltage of a partial discharge of the at least one terminal. The curved surface of the at least one terminal increases an inception voltage of a partial discharge of the at least one terminal by at least 20%. The curved surface of the at least one terminal increases an inception voltage of a partial discharge of the at least one terminal by at least 4 KV. The curved surface of the at least one terminal includes a radius of curvature that is 30% to 80% of a distance between the first planar surface and the second planar surface. The at least one buss bar includes a first planar surface, a second planar surface opposite the first planar surface, and a curved surface extending from the first planar surface to the second planar surface. The at least one buss bar includes a terminating end connected to the first planar surface and the second planar surface, and the terminating end further includes the curved surface extending from the first planar surface to the second planar surface. The at least one buss bar includes a terminating end connected to the first planar surface and the second planar surface, the at least one buss bar includes side surfaces connected to the first planar surface and the second planar surface, and the terminating end and the side surfaces each includes the curved surface extending from the first planar surface to the second planar surface. The terminating end and the side surfaces of the at least one buss bar are connected with a curved surface extending from the terminating end to the side surfaces. The at least one buss bar includes side surfaces connected to the first planar surface and the second planar surface, and the at least one buss bar includes a terminating end and the side surfaces each includes the curved surface extending from the first planar surface to the second planar surface. The at least one buss bar includes an aperture defined by a curved surface extending from the first planar surface to the second planar surface. A cross-section of the curved surface of the at least one buss bar includes at least one of the following: a partial circle, a partial ellipse, a partial parabola, a partial hyperbola, a partial squircle, or a partial superellipse. The at least one electrically conductive power substrate includes a metallic surface and/or a conductive surface supporting the plurality of power devices. A system includes at least one of the power module the system configured as one of the following: an inverter, a power system, a motor system, a converter, and an ac-dc power supply.

One example includes a power system. The power system also includes a power module includes at least one terminal. The power system also includes at least one buss bar electrically connected to the at least one terminal. The power system also includes the at least one terminal includes a first planar surface, a second planar surface opposite the first planar surface, and a curved surface extending from the first planar surface to the second planar surface. The power system also includes the at least one buss bar includes a first planar surface, a second planar surface opposite the first planar surface, and a curved surface extending from the first planar surface to the second planar surface.

The above-noted Example may further include any one or a combination of more than one of the following aspects. The power system where: the at least one terminal includes a terminating end connected to the first planar surface and the second planar surface, and the terminating end further includes the curved surface extending from the first planar surface to the second planar surface. The at least one terminal includes a terminating end connected to the first planar surface and the second planar surface, the at least one terminal includes side surfaces connected to the first planar surface and the second planar surface, and the terminating end and the side surfaces each includes the curved surface extending from the first planar surface to the second planar surface. The terminating end and the side surfaces are connected with a curved surface extending from the terminating end to the side surfaces. The at least one terminal includes side surfaces connected to the first planar surface and the second planar surface, and the at least one terminal includes a terminating end and the side surfaces each includes the curved surface extending from the first planar surface to the second planar surface. The at least one terminal includes an aperture defined by a curved surface extending from the first planar surface to the second planar surface. The at least one terminal includes a terminating end connected to the first planar surface and the second planar surface, the at least one terminal includes side surfaces connected to the first planar surface and the second planar surface, and the terminating end and the side surfaces each includes the curved surface extending from the first planar surface to the second planar surface. A cross-section of the curved surface includes at least one of the following: a partial circle, a partial ellipse, a partial parabola, a partial hyperbola, a partial squircle, or a partial superellipse. The curved surface of the at least one terminal reduces an electric field strength. The curved surface of the at least one terminal increases an inception voltage of a partial discharge of the at least one terminal. The curved surface of the at least one terminal includes a radius of curvature that is 30% to 80% of a distance between the first planar surface and the second planar surface. The at least one buss bar includes a terminating end connected to the first planar surface and the second planar surface, and the terminating end further includes the curved surface extending from the first planar surface to the second planar surface. The at least one buss bar includes a terminating end connected to the first planar surface and the second planar surface, the at least one buss bar includes side surfaces connected to the first planar surface and the second planar surface, and the terminating end and the side surfaces each includes the curved surface extending from the first planar surface to the second planar surface. The terminating end and the side surfaces of the at least one buss bar are connected with a curved surface extending from the terminating end to the side surfaces. The at least one buss bar includes side surfaces connected to the first planar surface and the second planar surface, and the at least one buss bar includes a terminating end and the side surfaces each includes the curved surface extending from the first planar surface to the second planar surface. The at least one buss bar includes an aperture defined by a curved surface extending from the first planar surface to the second planar surface. A cross-section of the curved surface of the at least one buss bar includes at least one of the following: a partial circle, a partial ellipse, a partial parabola, a partial hyperbola, a partial squircle, or a partial superellipse.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete, and will fully convey the scope of the disclosure to those skilled in the art. Additionally, the various aspects described may be implemented separately. Moreover, one or more the various aspects described may be combined. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Aspects of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical aspects of the disclosure and, although specific terms are employed, they are used in a generic and descriptive sense only and not for purposes of limitation, the scope of the disclosure being set forth in the following claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and the like are contemplated to be interchangeable, mixed, matched, combined, and the like. In this regard, the different features of the disclosure are modular and can be mixed and matched with each other.

What is claimed is:

1. A power component, comprising:
   at least one terminal comprising a first planar surface, a second planar surface opposite the first planar surface, and a curved surface extending from the first planar surface to the second planar surface;
   the at least one terminal further comprises side surfaces extending from the first planar surface to the second planar surface; and
   the side surfaces on a perimeter of the at least one terminal and the side surfaces each comprise the curved surface extending from the first planar surface to the second planar surface,
   wherein the power component comprises at least one of the following: a power module or a bus bar.

2. The power component of claim 1 wherein:
   the at least one terminal further comprises a terminating end connected to the first planar surface and the second planar surface; and
   the terminating end on the perimeter of the at least one terminal and the terminating end comprises the curved surface extending from the first planar surface to the second planar surface.

3. The power component of claim 1 wherein:
   the at least one terminal further comprises corner surfaces extending from the first planar surface to the second planar surface;
   the corner surfaces further define a surface that curves from the side surfaces to the terminating end; and
   the corner surfaces comprise the curved surface extending from the first planar surface to the second planar surface.

4. The power component of claim 1 wherein the at least one terminal comprises an aperture defined by an aperture surface that comprises a radius and a curved surface extending from the first planar surface to the second planar surface.

5. The power component of claim 1 wherein:
   the at least one terminal further comprises a terminating end connected to the first planar surface and the second planar surface and the terminating end on the perimeter of the at least one terminal;
   the terminating end comprises the curved surface extending from the first planar surface to the second planar surface;
   the at least one terminal further comprises corner surfaces extending from the first planar surface to the second planar surface;

the corner surfaces comprise the curved surface extending from the first planar surface to the second planar surface;

the corner surfaces further define a surface that curves from the side surfaces to the terminating end;

the at least one terminal further comprises an aperture defined by an aperture surface that comprises a radius and a curved surface extending from the first planar surface to the second planar surface.

6. The power component of claim 1 wherein the curved surface of the at least one terminal reduces an electric field strength.

7. The power component of claim 1 wherein the curved surface of the at least one terminal increases an inception voltage of a partial discharge of the at least one terminal.

8. The power component of claim 1 wherein the curved surface of the at least one terminal increases an inception voltage of a partial discharge of the at least one terminal by 25%-225%.

9. The power component of claim 1 wherein the curved surface of the at least one terminal increases an inception voltage of a partial discharge of the at least one terminal by 2 KV-19 KV.

10. The power component of claim 1 wherein the curved surface of the at least one terminal comprises a radius of curvature that is 30% to 80% of a distance between the first planar surface and the second planar surface.

11. The power component of claim 1 wherein a cross-section of the curved surface comprises at least one of the following: a partial circle, a partial ellipse, a partial parabola, a partial hyperbola, a partial squircle, or a partial superellipse.

12. The power component of claim 1 wherein the at least one terminal is implemented in the power component comprising the power module and the power module comprises:
at least one electrically conductive power substrate;
a housing arranged on the at least one electrically conductive power substrate;
a plurality of power devices arranged on and connected to the at least one electrically conductive power substrate; and
a base plate,
wherein the at least one terminal is electrically connected to the plurality of power devices.

13. A power system comprising the power component of claim 1, wherein the power system is configured as one of the following: an inverter, a power system, a motor system, a converter, and an AC-DC power supply.

14. The power component of claim 1 wherein the at least one terminal is implemented in the power component that comprises the bus bar.

15. A power module, comprising:
at least one electrically conductive power substrate;
a housing arranged on the at least one electrically conductive power substrate;
at least one terminal comprising a first planar surface, a second planar surface opposite the first planar surface, and a curved surface extending from the first planar surface to the second planar surface;
the at least one terminal further comprises side surfaces extending from the first planar surface to the second planar surface; and
the side surfaces on a perimeter of the at least one terminal and the side surfaces each comprise the curved surface extending from the first planar surface to the second planar surface;

a plurality of power devices arranged on and connected to the at least one electrically conductive power substrate; and
a base plate,
wherein the at least one terminal is electrically connected to the at least one electrically conductive power substrate.

16. The power module of claim 15 wherein:
the at least one terminal further comprises a terminating end connected to the first planar surface and the second planar surface; and
the terminating end on the perimeter of the at least one terminal and the terminating end further comprises the curved surface extending from the first planar surface to the second planar surface.

17. The power module of claim 15 wherein:
the at least one terminal further comprises a terminating end connected to the first planar surface and the second planar surface;
the at least one terminal further comprises corner surfaces connected to the first planar surface and the second planar surface;
the corner surfaces further define a surface that curves from the side surfaces to the terminating end; and
the terminating end and the corner surface each comprise the curved surface extending from the first planar surface to the second planar surface.

18. The power module of claim 17
wherein the terminating end is arranged on a perimeter of the at least one terminal; and
wherein the terminating end and the side surfaces are connected with a curved surface extending from the terminating end to the side surfaces.

19. The power module of claim 15 wherein the at least one terminal further comprises an aperture an aperture surface that comprises a radius and defined by a curved surface extending from the first planar surface to the second planar surface.

20. The power module of claim 15 wherein a cross-section of the curved surface comprises at least one of the following: a partial circle, a partial ellipse, a partial parabola, a partial hyperbola, a partial squircle, or a partial superellipse.

21. A power system, comprising:
a power module comprising at least one terminal; and
at least one bus bar electrically connected to the at least one terminal,
the at least one terminal comprising a first planar surface, a second planar surface opposite the first planar surface, and a curved surface extending from the first planar surface to the second planar surface; and
the at least one bus bar comprises a first planar surface, a second planar surface opposite the first planar surface, and a curved surface extending from the first planar surface to the second planar surface.

22. The power system of claim 21 wherein:
the at least one terminal comprises a terminating end connected to the first planar surface and the second planar surface; and
the terminating end further comprises the curved surface extending from the first planar surface to the second planar surface.

23. The power system of claim 21 wherein:
the at least one terminal comprises a terminating end connected to the first planar surface and the second planar surface;

the at least one terminal comprises side surfaces connected to the first planar surface and the second planar surface; and the terminating end and the side surfaces each comprise the curved surface extending from the first planar surface to the second planar surface.

24. The power system of claim 23 wherein the terminating end and the side surfaces are connected with a curved surface extending from the terminating end to the side surfaces.

25. The power system of claim 21 wherein:

the at least one terminal comprises side surfaces connected to the first planar surface and the second planar surface; and the at least one terminal comprises a terminating end and the side surfaces each comprise the curved surface extending from the first planar surface to the second planar surface.

26. The power system of claim 21 wherein the at least one terminal comprises an aperture defined by a curved surface extending from the first planar surface to the second planar surface.

* * * * *